United States Patent
Ling et al.

(10) Patent No.: US 12,349,336 B2
(45) Date of Patent: Jul. 1, 2025

(54) MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Chia-Yu Ling, Hsinchu (TW); Katherine H. Chiang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 657 days.

(21) Appl. No.: 17/742,520

(22) Filed: May 12, 2022

(65) Prior Publication Data

US 2023/0371234 A1 Nov. 16, 2023

(51) Int. Cl.
H10B 12/00 (2023.01)

(52) U.S. Cl.
CPC ......... *H10B 12/312* (2023.02); *H10B 12/053* (2023.02); *H10B 12/056* (2023.02)

(58) Field of Classification Search
CPC ... H10B 12/312; H10B 12/056; H10B 12/053
See application file for complete search history.

(56) References Cited

U.S. PATENT DOCUMENTS

| 2015/0187775 A1* | 7/2015 | Yamamoto | H10D 87/00 257/43 |
| 2023/0189495 A1* | 6/2023 | Morrow | H10D 89/10 257/351 |
| 2023/0282643 A1* | 9/2023 | Gardner | H10D 30/6713 257/351 |

* cited by examiner

Primary Examiner — Douglas M Menz
(74) Attorney, Agent, or Firm — Birch, Stewart, Kolasch & Birch, LLP

(57) ABSTRACT

A memory device includes a first transistor and a second transistor. Each of the first and second transistors includes a first source/drain electrode, a second source/drain electrode, a channel feature, a gate dielectric and a gate electrode. The second source/drain electrode is coplanar with the first source/drain electrode. The channel feature is disposed between and interconnects the first and second source/drain electrodes. The gate dielectric is disposed over the channel feature. The gate electrode is disposed over the gate dielectric, and overlaps the channel feature. The second transistor is disposed over the first transistor. The first source/drain electrode of the second transistor is connected to the gate electrode of the first transistor.

20 Claims, 32 Drawing Sheets

MEMORY DEVICE AND METHOD FOR MANUFACTURING THE SAME

BACKGROUND

Semiconductor memory devices are widely used in integrated circuits (ICs) to store digital data for electronic applications. A conventional design of a memory cell includes two transistors that are connected to each other. A bit of data can be written to a gate terminal of a first one of the transistors when a second one of the transistors conducts, and can be kept at the gate terminal of the first transistor because of capacitance at the gate terminal of the first transistor when the second transistor does not conduct.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 8, 10, 11, 13, 15, 17, 19, 21, 23, 24, 26, 28 and 29 are schematic sectional views and FIGS. 7, 9, 12, 14, 16, 18, 20, 22, 25, 27 and 30 are schematic top views.

DETAILED DESCRIPTION

Figure 1:
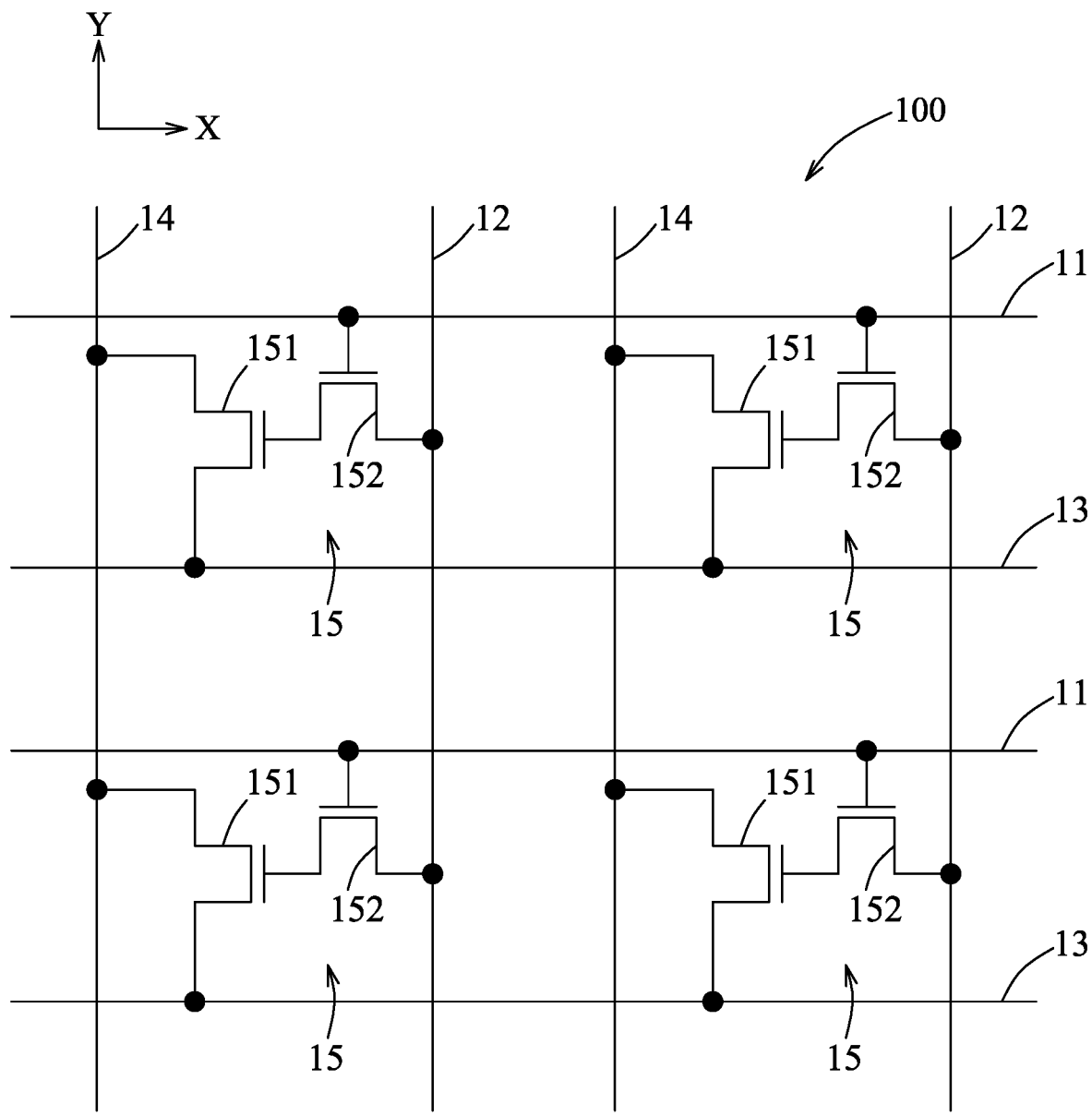
FIG. 1 is a circuit diagram illustrating a memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

FIG. 1 is a circuit diagram illustrating a memory device 100 in accordance with some embodiments. The memory device 100 includes a plurality of write word lines 11, a plurality of write bit lines 12, a plurality of read word lines 13, a plurality of read bit lines 14 and a plurality of memory cells 15. The write word lines 11 and the read word lines 13 extend in an X direction. The write bit lines 12 and the read bit lines 14 extend in a Y direction traverse to the X direction. Each of the memory cells 15 has a first transistor 151 and a second transistor 152. Each of the first and second transistors 151, 152 is an n-type transistor. The first transistor 151 has a first source/drain terminal that is connected to a corresponding one of the read word lines 13, a second source/drain terminal that is connected to a corresponding one of the read bit lines 14, and a gate terminal. The second transistor 152 has a first source/drain terminal that is connected to the gate terminal of the first transistor 151, a second source/drain terminal that is connected to a corresponding one of the write bit lines 12, and a gate terminal that is connected to a corresponding one of the write word lines 11.

For each of the memory cells 15, to write a bit of data (logic "0" or logic "1") to the memory cell 15, a data voltage representing the bit of data (e.g., 1 volt for logic "1" and 0 volts for logic "0") is provided to the corresponding write bit line 12, a conduction voltage (e.g., 1.5 volts) is provided to the corresponding write word line 11 so as to make the second transistor 152 conducting, and a reference voltage (e.g., 0 volts) is provided to the corresponding read word line 13 and the corresponding read bit line 14. The bit of data is transmitted from the corresponding write bit line 12 to the gate terminal of the first transistor 151 through the conducting second transistor 152. A voltage at the gate terminal of the first transistor 151 approaches 0 volts if the bit of data is logic "0", and approaches 1 volt if the bit of data is logic "1". After the write operation, the bit of data is kept at the gate terminal of the first transistor 151.

For each of the memory cells 15, to read the bit of data from the memory cell 15, the corresponding read bit line 14 is precharged to a voltage (e.g., a supply voltage (Vdd)) higher than the reference voltage, the reference voltage is provided to the corresponding write bit line 12 and the corresponding read word line 13, and a non-conduction voltage (e.g., −0.4 volts) is provided to the corresponding write word line 11 so as to make the second transistor 152 non-conducting. If the bit of data kept at the gate terminal of the first transistor 151 is logic "0", the first transistor 151 does not conduct, and the corresponding read bit line 14 stays precharged to the supply voltage (Vdd). If the bit of data kept at the gate terminal of the first transistor 151 is logic "1", the first transistor 151 conducts, and the corresponding read bit line 14 is discharged by the reference voltage through the conducting first transistor 151 so as to fall to a voltage approaching 0 volts.

Figure 2:
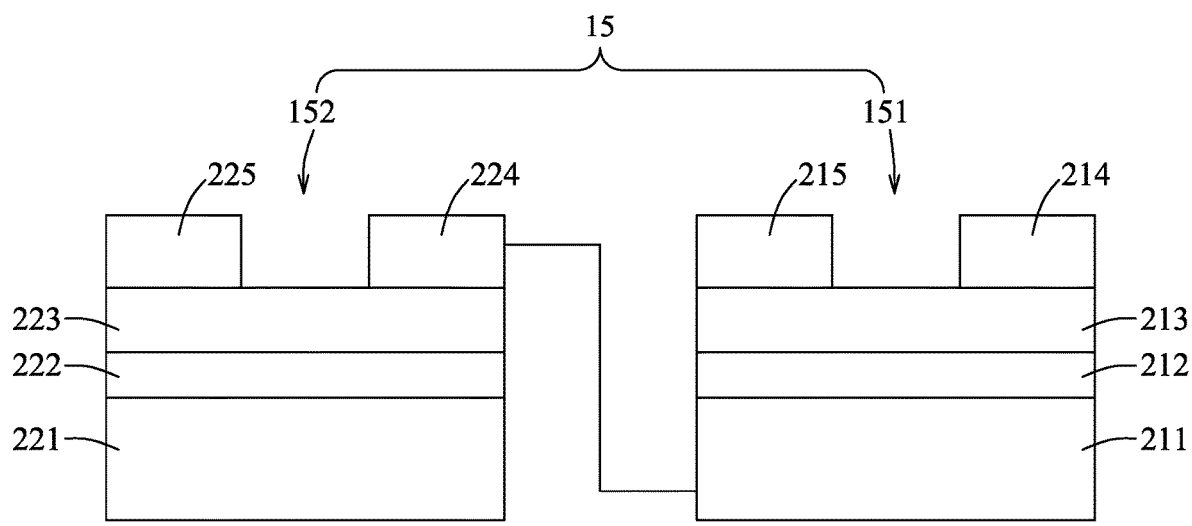
FIG. 2 is a schematic sectional view of a memory cell of a memory device in accordance with some embodiments.

FIG. 2 is a schematic sectional view of each of the memory cells 15 in accordance with some embodiments. For each of the memory cells 15, the first and second transistors 151, 152 are coplanar with each other. Each of the first and second transistors 151, 152 includes a gate electrode 211/221, a gate dielectric 212/222, a channel feature 213/223, a first source/drain electrode 214/224 and a second source/drain electrode 215/225. The gate electrode 211/221, the first source/drain electrode 214/224 and the second source/drain electrode 215/225 respectively serve as the gate terminal, the first source/drain terminal and the second source/drain terminal of the transistor 151/152. The gate electrode 211/212, the gate dielectric 212/222 and the channel feature 213/223 are stacked from bottom to top. The first source/drain electrode 214/224 and the second source/drain electrode 215/225 are disposed above the channel feature 213/223, and are coplanar with and spaced apart from each other.

Figure 3:
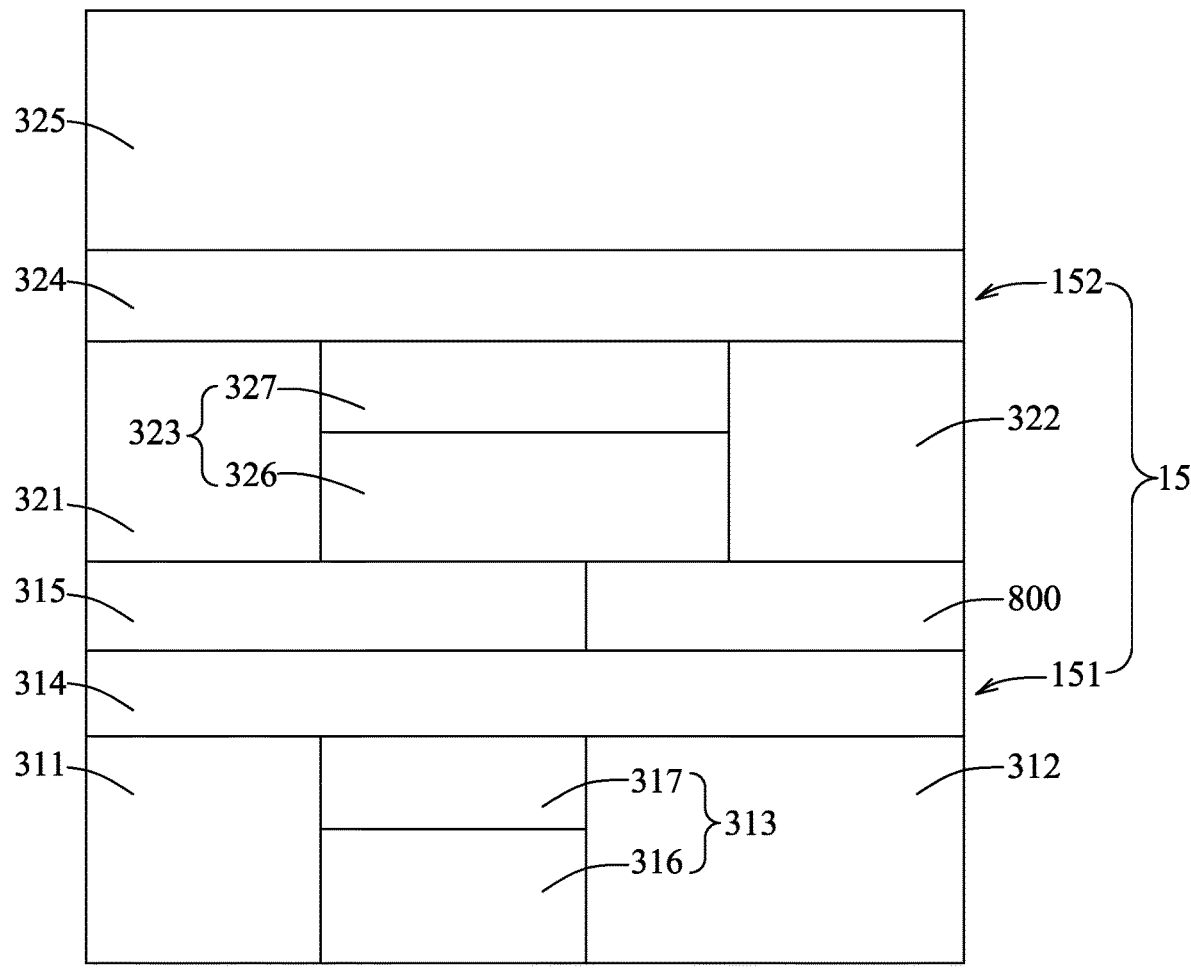
FIG. 3 is a schematic sectional view of a memory cell of a memory device in accordance with some embodiments.

FIG. 3 is a schematic sectional view of each of the memory cells 15 in accordance with some embodiments. For each of the memory cells 15, the second transistor 152 is disposed over the first transistor 151. Each of the first and second transistors 151, 152 includes a first source/drain electrode 311/321, a second source/drain electrode 312/322, a channel feature 313/323, a gate dielectric 314/324 and a gate electrode 315/325. The first source/drain electrode 311/321, the second source/drain electrode 312/322 and the gate electrode 315/325 respectively serve as the first source/drain terminal, the second source/drain terminal and the gate terminal of the transistor 151/152. The second source/drain electrode 312/322 is coplanar with and spaced apart from the first source/drain electrode 311/321. The channel feature 313/323 is disposed between and interconnects the first source/drain electrode 311/321 and the second source/drain electrode 312/322. The channel feature 313/323 is n-type doped, and includes a plurality of layers (e.g., two layers 316/326, 317/327 as shown in FIG. 3) that are arranged from bottom to top and that have different doping concentrations. The gate dielectric 314/324 is disposed over the channel feature 313/323. The gate electrode 315/325 is disposed over the gate dielectric 314/324, and overlaps the channel feature 313/323. The gate electrode 315 of the first transistor 151 contacts the first source/drain electrode 321 of the second transistor 152, and is spaced apart from the second source/drain electrode 322 of the second transistor 152. It should be noted that an element 800 including a dielectric material is disposed coplanar with the gate electrode 315 of the first transistor 151, and is used to keep the second source/drain electrode 322 and the channel feature 323 of the second transistor 152 above the gate electrode 315 of the first transistor 151.

In some embodiments, for the channel feature 313/323 of each of the first and second transistors 151, 152 of the memory cell 15, the doping concentration of one of the layers is greater than the doping concentration of a next one of the layers in a top-to-bottom direction of the layers, so that a threshold voltage of the transistor 151/152 can be well controlled. In the example where the channel feature 313/323 includes two layers 316/326, 317/327, the doping concentration of the layer 317/327 is greater than the doping concentration of the layer 316/326.

Figure 4:
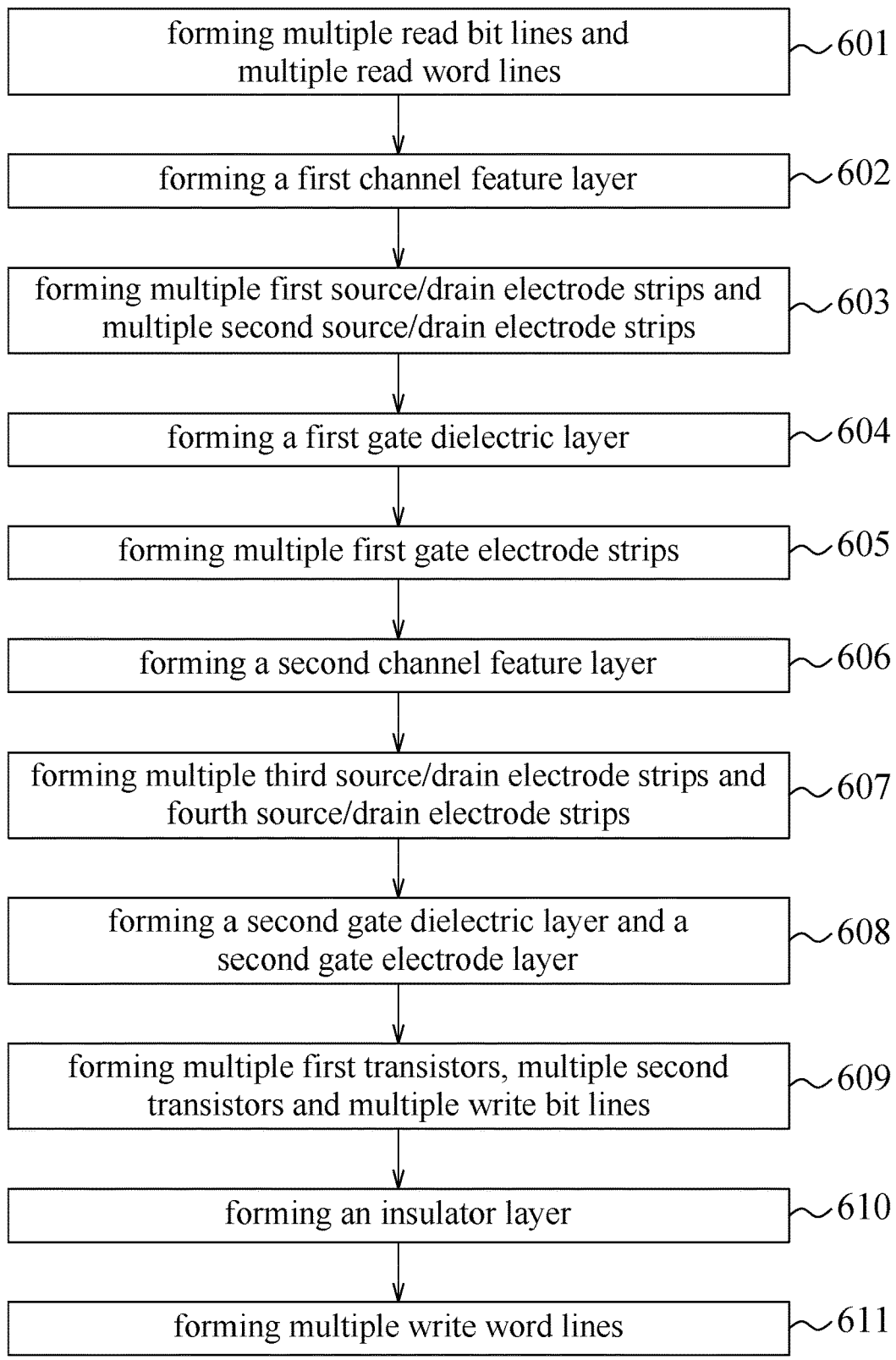
FIG. 4 is a flow chart illustrating a method for manufacturing a memory device in accordance with some embodiments.

FIG. 4 is a flow chart illustrating a method 600 for manufacturing a memory device in accordance with some embodiments. FIGS. 5 to 29 are schematic sectional views and schematic top views of semiconductor structures 700 during various stages of the method 600. The method 600 and the semiconductor structures 700 are collectively described below. However, additional steps can be provided before, after or during the method 600, and some of the steps described herein may be replaced by other steps or be eliminated. Similarly, further additional features may be present in the semiconductor structures 700, and/or features present may be replaced or eliminated in additional embodiments.

Figure 5:
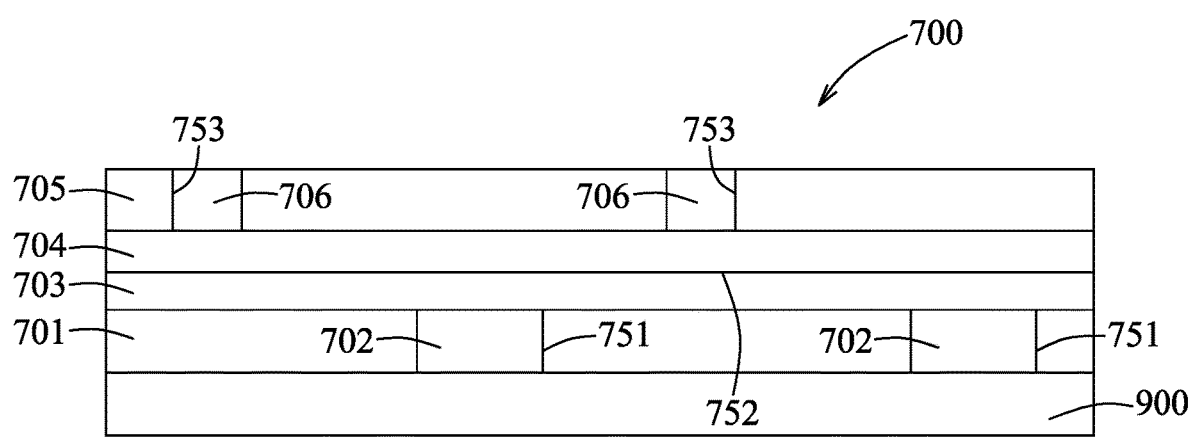
FIGS. 5 to 30 illustrate intermediate stages of the method for manufacturing a memory device in accordance with some embodiments, where
Figure 6:
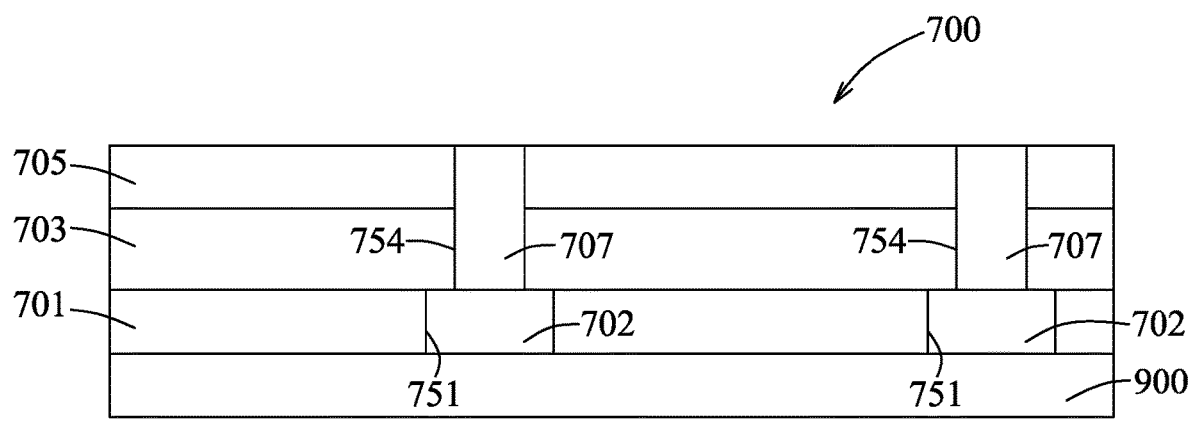
Figure 7:
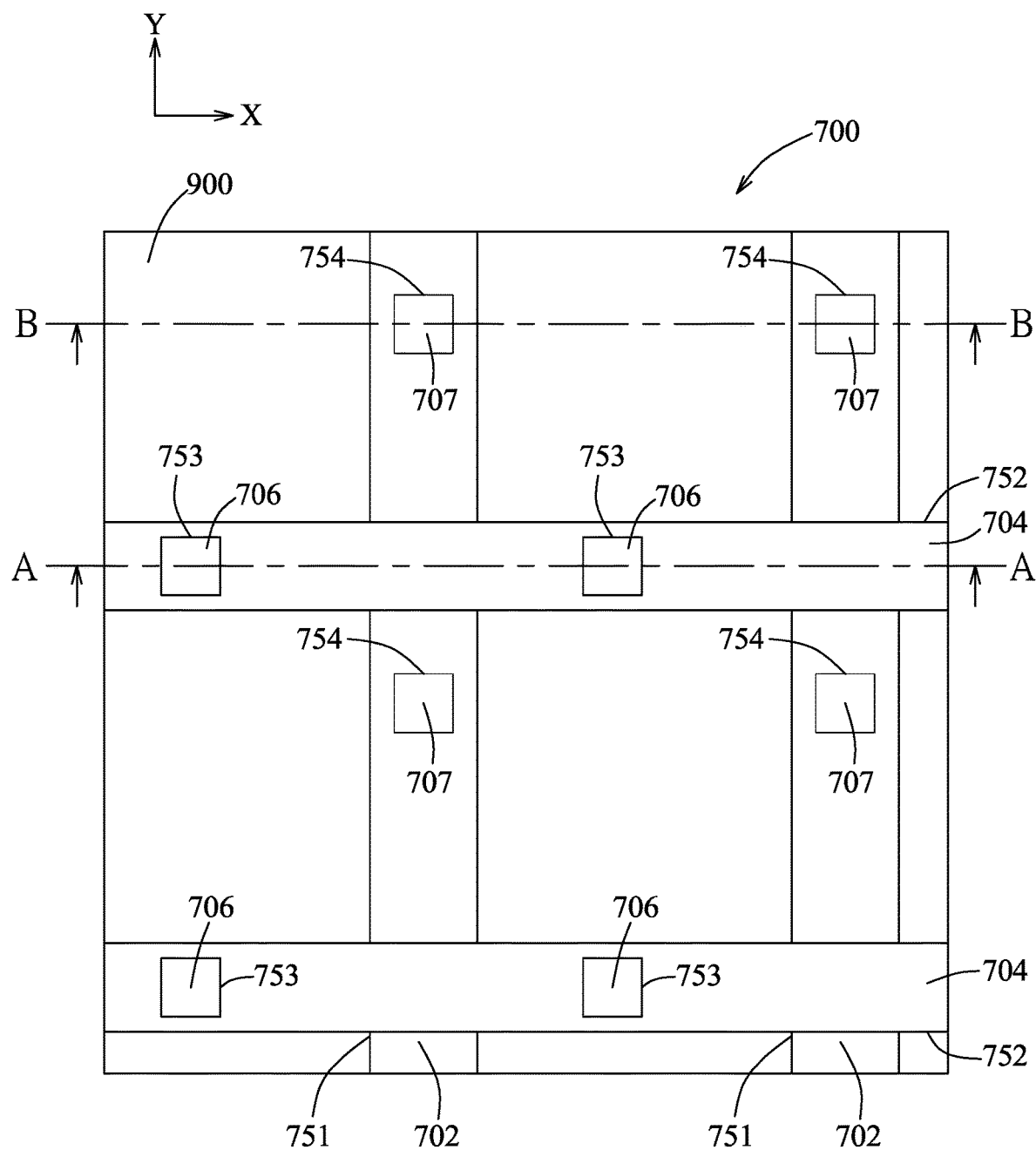

Referring to FIGS. 4, 5, 6 and 7, where FIG. 5 illustrates a schematic sectional view taken along line A-A in FIG. 7 and FIG. 6 illustrates a schematic sectional view taken along line B-B in FIG. 7, the method 600 begins at block 601, where a plurality of read bit lines extending in a Y direction and a plurality of read word lines extending in an X direction traverse to the Y direction are sequentially formed on a substrate. Block 601 may be implemented as described below. Firstly, a first interlayer dielectric (ILD) layer 701 may be deposited on the substrate 900; the first ILD layer 701 may be patterned to form a plurality of first trenches 751 that extend in the Y direction; a conductive material may be deposited on the first ILD layer 701 so as to fill the first trenches 751; and an excess portion of the conductive material on the first ILD layer 701 may removed. The remaining portions of the conductive material in the first trenches 751 are referred to as the read bit lines 702 that would serve as the read bit lines 14 (see FIG. 1). Secondly, a second ILD layer 703 may be deposited on the first ILD layer 701 and the read bit lines 702; the second ILD layer 703 may be patterned to form a plurality of second trenches 752 that extend in the X direction and that do not expose the read bit lines 702; a conductive material may be deposited on the second ILD layer 703 so as to fill the second trenches 752; and an excess portion of the conductive material on the second ILD layer 703 may be removed. The remaining portions of the conductive material in the second trenches 752 are referred to as the read word lines 704 that would serve as the read word lines 13 (see FIG. 1). Thirdly, a third ILD layer 705 may be deposited on the second ILD layer 703 and the read word lines 704. Fourthly, the third ILD layer 705 may be patterned to form a plurality of first via holes 753 each exposing a corresponding one of the read word lines 704; a conductive material may be deposited on the third ILD layer 705 so as to fill the first via holes 753; and an excess portion of the conductive material on the third ILD layer 705 may be removed. The remaining portions of the conductive material in the first via holes 753 are referred to as first connection vias 706. Fifthly, the third ILD layer 705 and the second ILD layer 703 may be patterned to form a plurality of second via holes 754 each exposing a corresponding one of the read bit lines 702; a conductive material may be deposited on the third ILD layer 705 so as to fill the second via holes 754; and an excess portion of the conductive material on the third ILD layer 705 may be removed. The remaining portions of the conductive material in the second via holes 754 are referred to as second connection vias 707. It should be noted that the first to third ILD layers 701, 703, 705 are omitted from FIG. 7 in order to show the main structure of the semiconductor structure 700 clearly. In some embodiments, the substrate 900 may be a silicon substrate that is formed with a circuit (e.g., a central processing unit (CPU)) that writes data to and reads data from a memory device, so the semiconductor device 700 is fabricated in the back-end-of-line (BEOL). In some embodiments, each of the first to third ILD layers 701, 703, 705 and the conductive materials for forming the read bit lines 702, the read word lines 704, the first connection vias 706 and the second connection vias 707 may be deposited using, for example, chemical vapor deposition (CVD), plasma enhanced chemical vapor deposition (PECVD), physical vapor deposition (PVD), atomic layer deposition (ALD), other suitable deposition techniques, or combinations thereof. In some embodiments, each of the first to third ILD layers 701, 703, 705 may be patterned using a photolithography process and an etching process. The photolithography process for patterning each of the first to third ILD layers 701, 703, 705 may include, for example, but not limited to, coating the ILD layer 701/703/705 with a photoresist, soft-baking, exposing the photoresist through a photomask, post-exposure baking, developing the photoresist, and hard-baking, so as to form a patterned photoresist. The etching process for patterning each of the first to third ILD layers 701, 703, 705 may be implemented by etching the ILD layer 701/703/705 through the patterned photoresist using, for example, dry etching, wet etching, other suitable techniques, or combinations thereof. The patterned photoresist may be removed after the etching process. In some embodiments, the excess portion of each of the conductive materials for forming the read bit lines 702, the read word lines 704, the first connection vias 706 and the second connection vias 707 may be removed using, for example, chemical mechanical polishing (CMP), or other suitable planarization techniques. In some embodiments, each of the first to third ILD layers 701, 703, 705 may include, for example, silicon oxide, silicon nitride, silicon oxynitride, fluoride-doped silicate glass, a material with low dielectric constant (i.e., a dielectric material that has a dielectric constant smaller than that of silicon dioxide), other suitable materials, or combinations thereof. In some embodiments, each of the conductive materials for forming the read bit lines 702, the read word lines 704, the first connection vias 706 and the second connection vias 707 may include TaN, TiN, W, Al, polysilicon, Ru, Co, Cu, Al—Cu alloy, other suitable materials, or combinations thereof.

Figure 8:
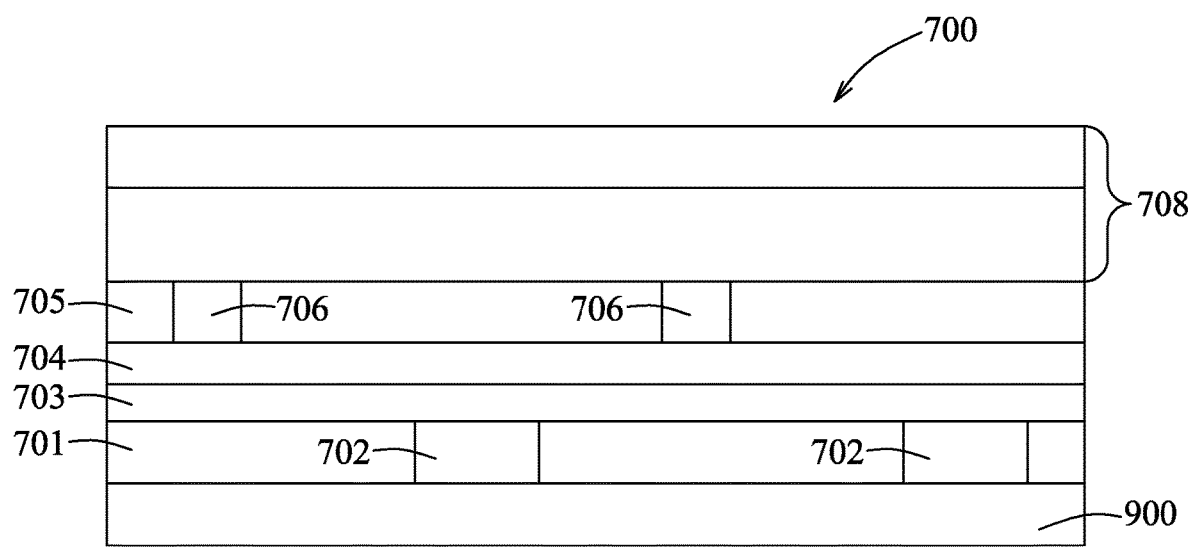
Figure 9:
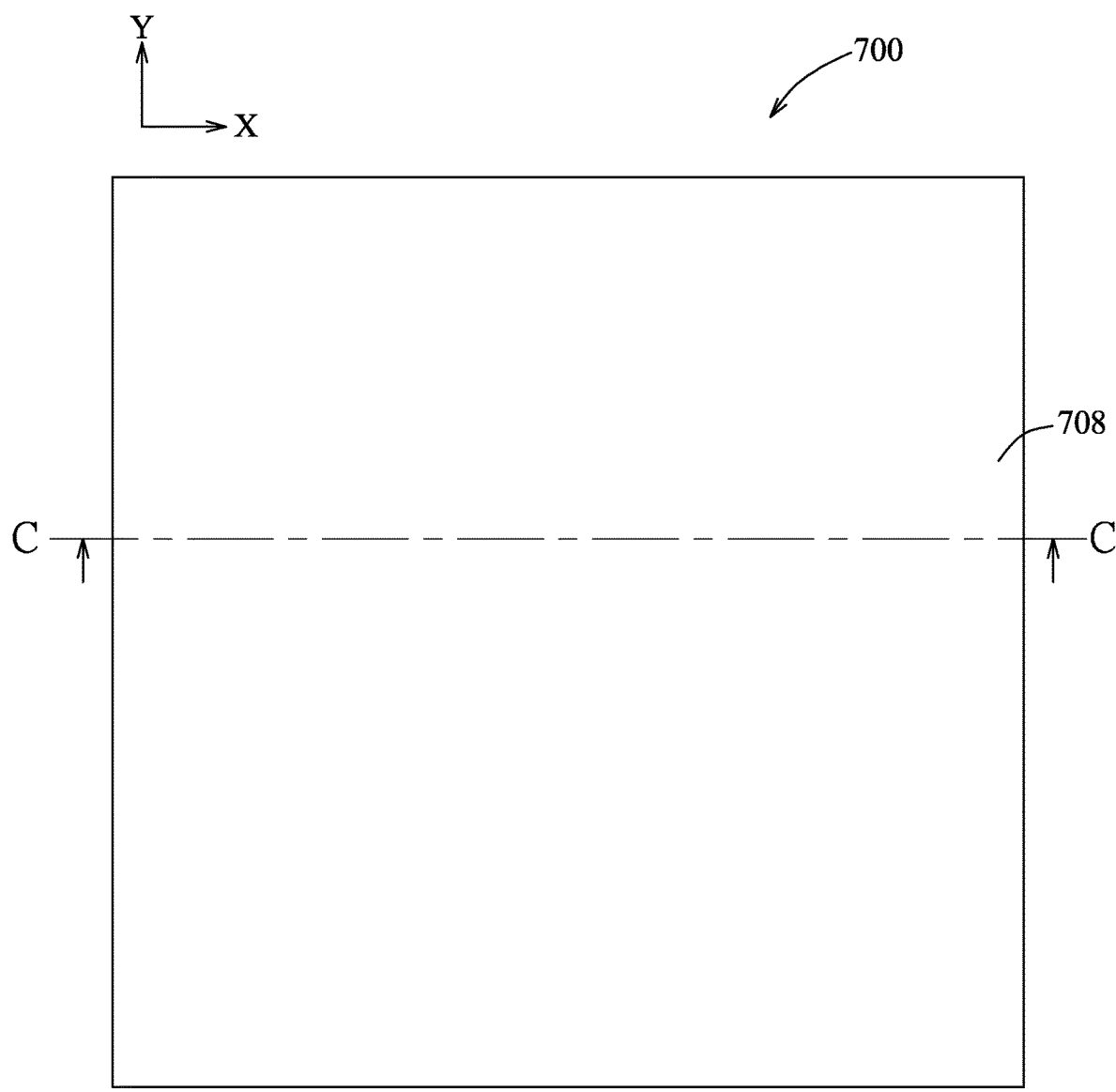

Referring to FIGS. 8 and 9, where FIG. 8 illustrates a schematic sectional view taken along line C-C in FIG. 9, the method 600 then proceeds to block 602, where a first channel feature layer 708 is formed on the third dielectric layer 705, the first connection vias 706 and the second connection vias 707 (see FIG. 6). The first channel feature layer 708 includes a plurality of channel layers (e.g., two channel layers as shown in FIG. 8) that are arranged from bottom to top. In some embodiments, each of the channel layers may be formed using, for example, CVD, PECVD, PVD, ALD, other suitable deposition techniques, or combinations thereof. In some embodiments, the channel layers may be n-type doped, and may include IGZO, ZnO, $In_2O_3$, $SnO_2$, other suitable materials, or combinations thereof. In some embodiments, one of the channel layers has a doping concentration greater than that of a next one of the channel layers in a top-to-bottom direction of the channel layers.

Figure 10:
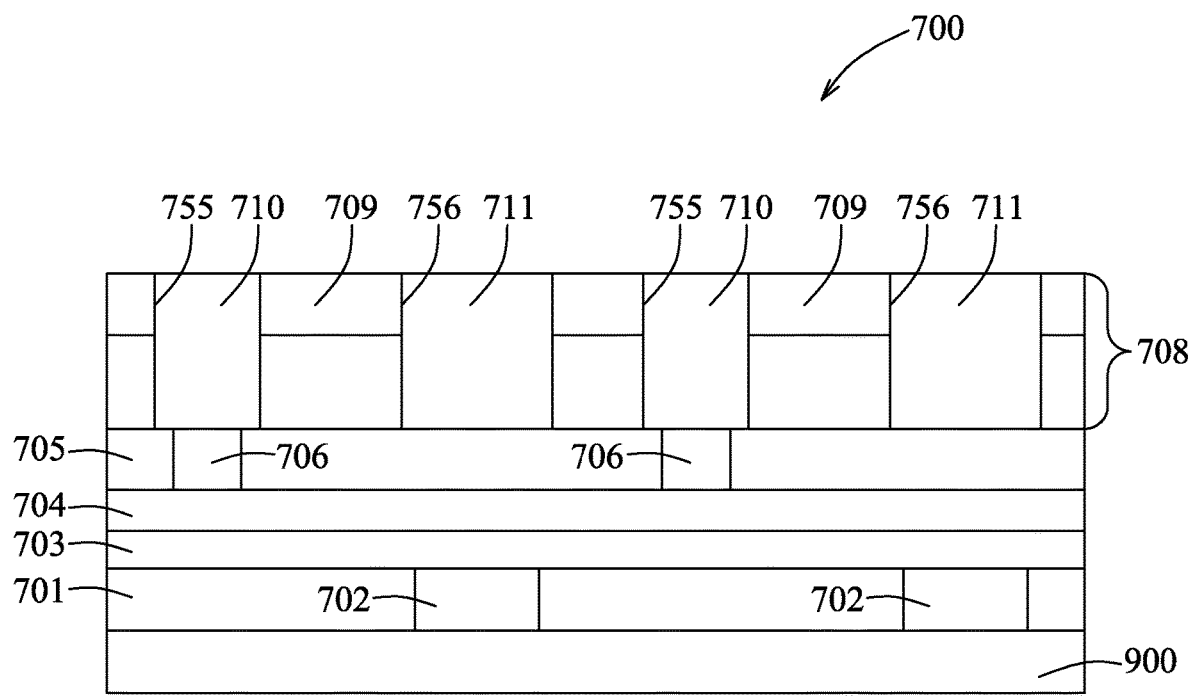
Figure 11:
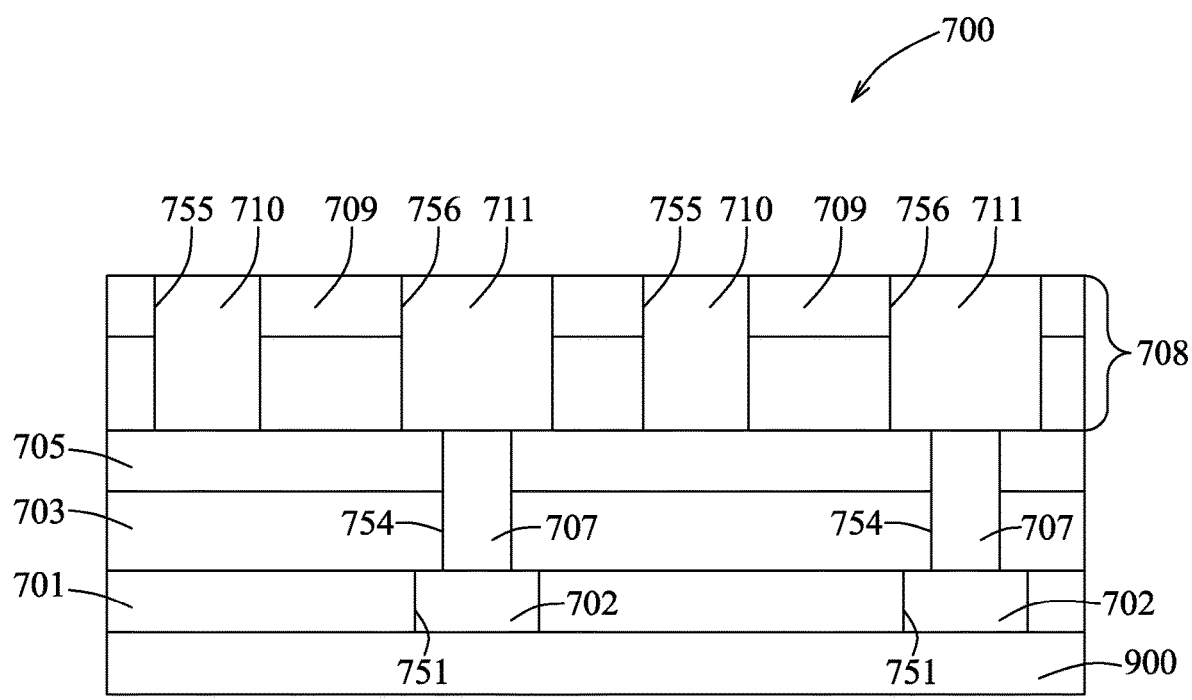
Figure 12:
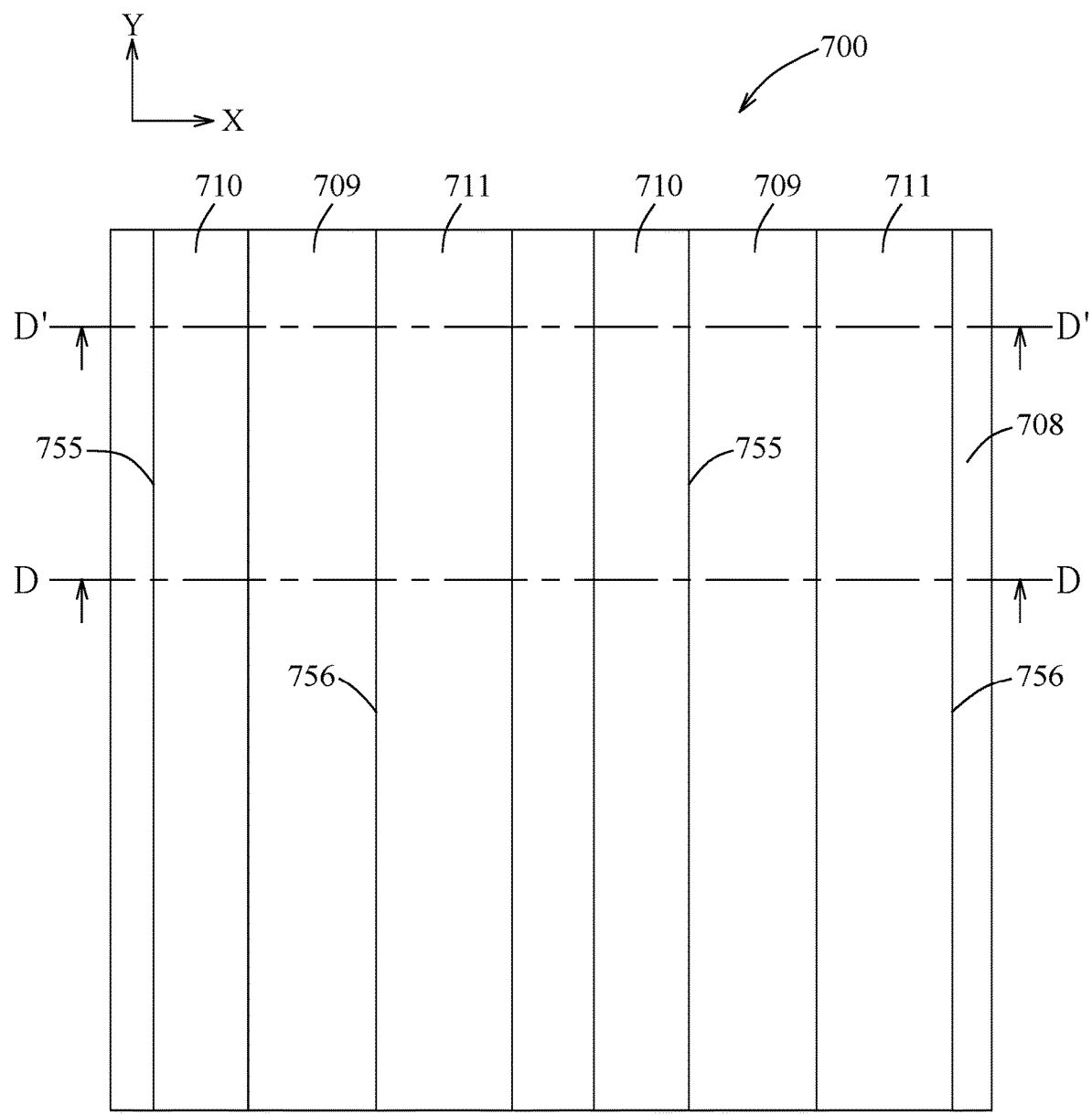

Referring to FIGS. 10, 11 and 12, where FIG. 10 illustrates a schematic sectional view taken along line D-D in FIG. 12 and FIG. 11 illustrates a schematic sectional view taken along line D'-D' in FIG. 12, the method 600 then proceeds to block 603, where a plurality of first source/drain electrode strips 710 extending in the Y direction and a plurality of second source/drain electrode strips 711 extending in the Y direction are formed in the first channel feature layer 708. The first source/drain electrode strips 710 are arranged alternatingly with the second source/drain electrode strips 711. Block 603 may be implemented as described below. Firstly, the first channel feature layer 708 is patterned to form a plurality of third trenches 755 that extend in the Y direction and that expose the first connection vias 706, and a plurality of fourth trenches 756 that extend in the Y direction and that expose the second connection vias 707. Secondly, a conductive material is deposited on the first channel feature layer 708 so as to fill the third and fourth trenches 755, 756. Thirdly, an excess portion of the conductive material on the first channel feature layer 708 is removed. The remaining portions of the conductive material in the third trenches 755 are referred to as the first source/drain electrode strips 710. The remaining portions of the conductive material in the fourth trenches 756 are referred to as the second source/drain electrode strips 711. Portions of the first channel feature layer 708, each between a respective one of the first source/drain electrode strips 710 and a respective one of the second source/drain electrode strips 711, are referred to as first channel feature strips 709. In some embodiments, the first channel feature layer 708 may be patterned using a photolithography process and an etching process. The photolithography process may include, for example, but not limited to, coating the first channel feature layer 708 with a photoresist, soft-baking, exposing the photoresist through a photomask, post-exposure baking, developing the photoresist, and hard-baking, so as to form a patterned photoresist. The etching process may be implemented by etching the first channel feature layer 708 through the patterned photoresist using, for example, dry etching, wet etching, other suitable techniques, or combinations thereof. The patterned photoresist may be removed after the etching process. In some embodiments, the conductive material may be deposited using, for example, CVD, PECVD, PVD, ALD, other suitable deposition techniques, or combinations thereof. In some embodiments, the excess portion of the conductive material may be removed using, for example, CMP, or other suitable planarization techniques. In some embodiments, the conductive material may include TaN, TiN, W, Al, polysilicon, Ru, Co, Cu, other suitable materials, or combinations thereof.

Figure 13:
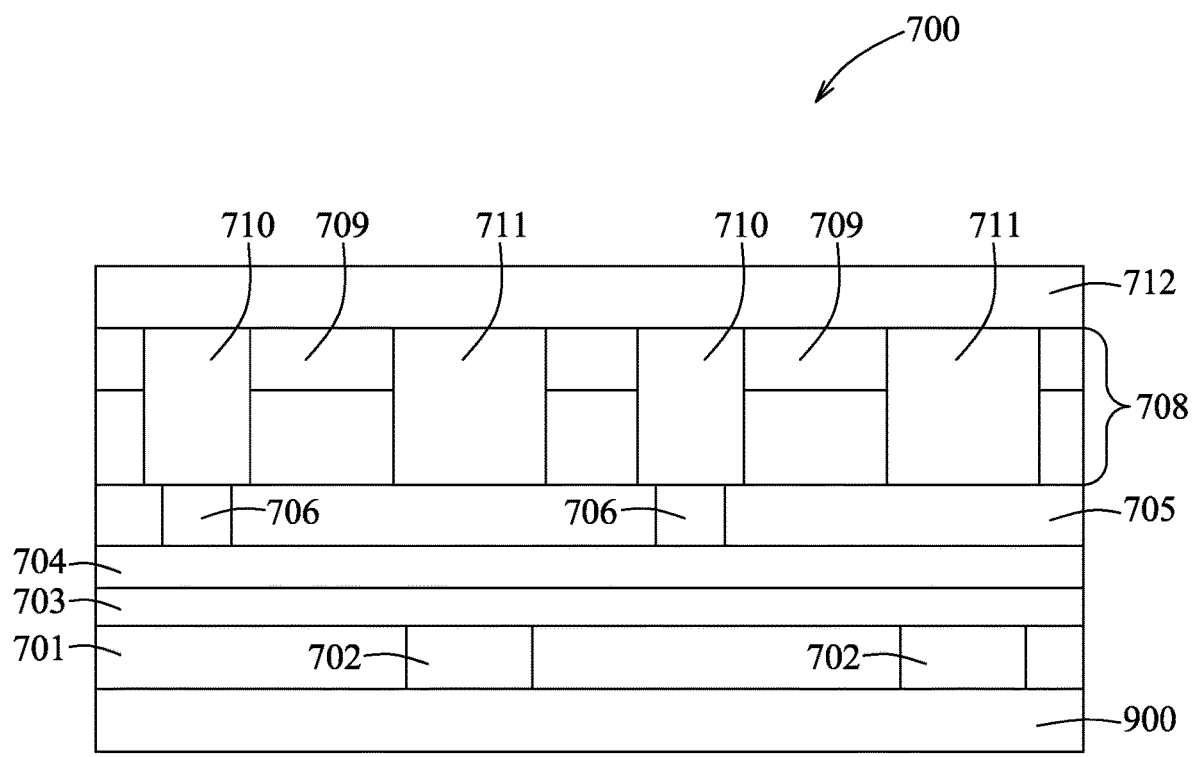
Figure 14:
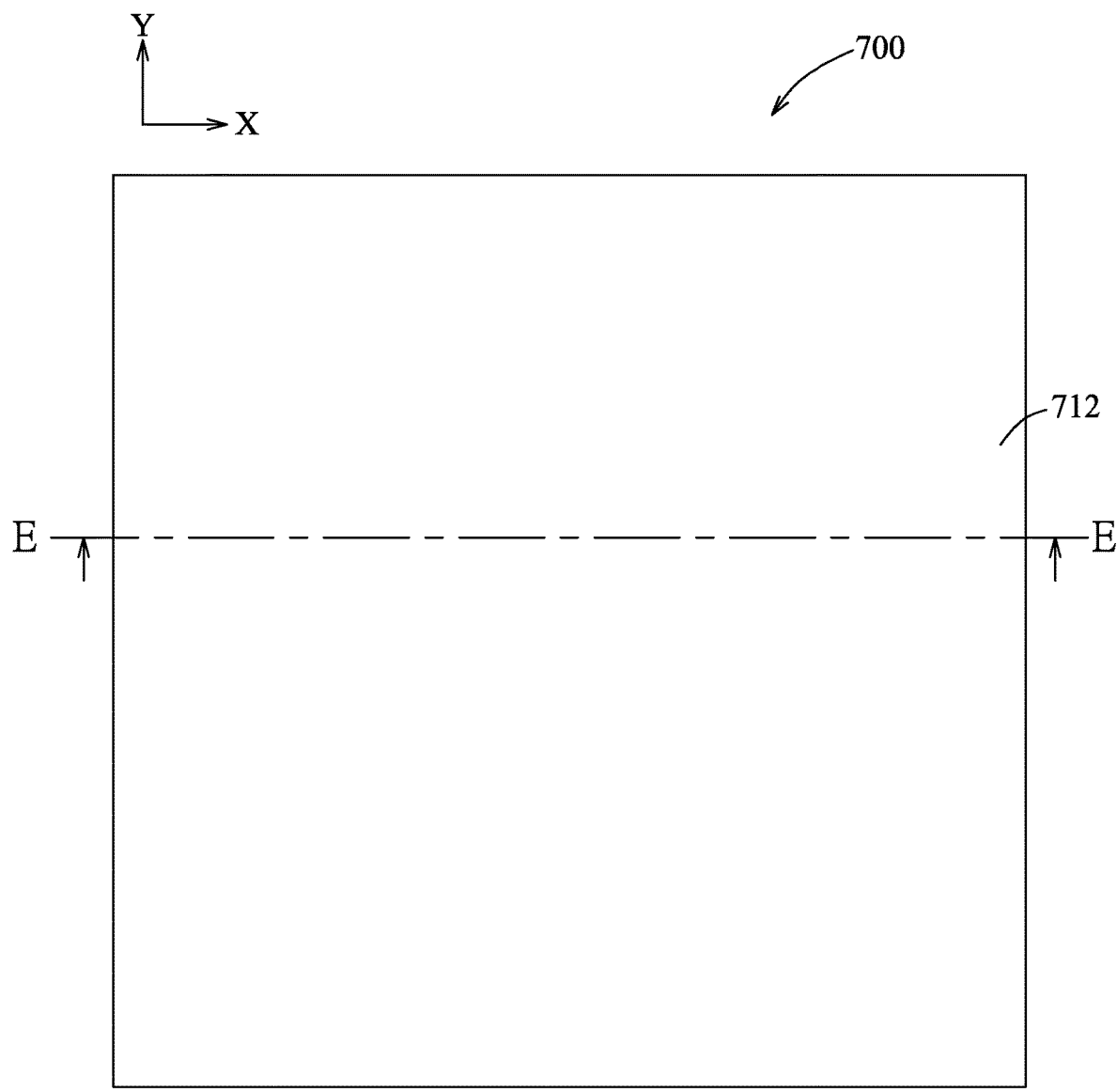

Referring to FIGS. 13 and 14, where FIG. 13 illustrates a schematic sectional view taken along line E-E in FIG. 14, the method 600 then proceeds to block 604, where a first gate dielectric layer 712 is formed on the first channel feature layer 708, the first source/drain electrode strips 710 and the second source/drain electrode strips 711. In some embodiments, the first gate dielectric layer 712 may be formed using, for example, CVD, ALD, other suitable deposition techniques, or combinations thereof. In some embodiments, the first gate dielectric layer 712 may include a material with high dielectric constant such as $HfO_2$, $SiO_2$, $Al_2O_3$, SiON, other suitable materials, or combinations thereof.

Figure 15:
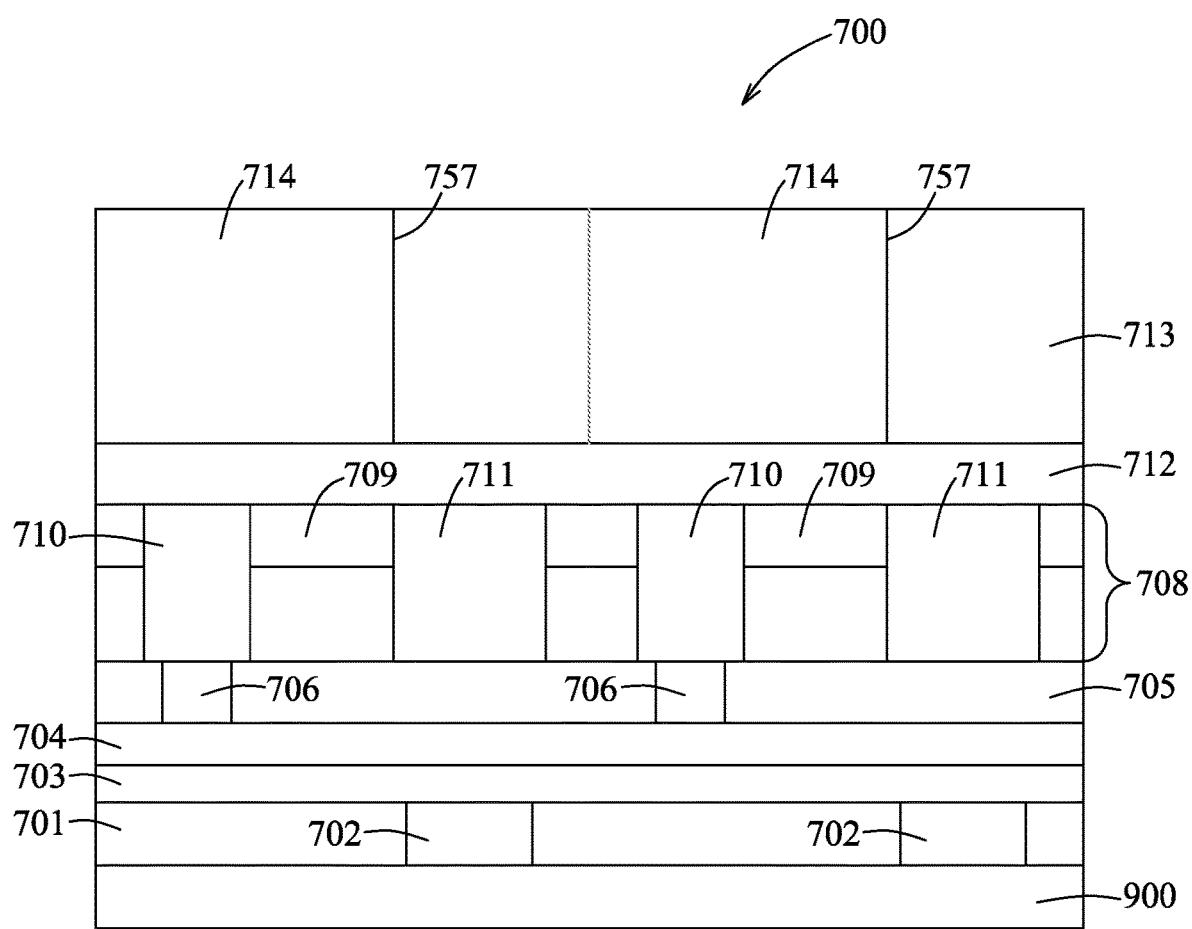
Figure 16:
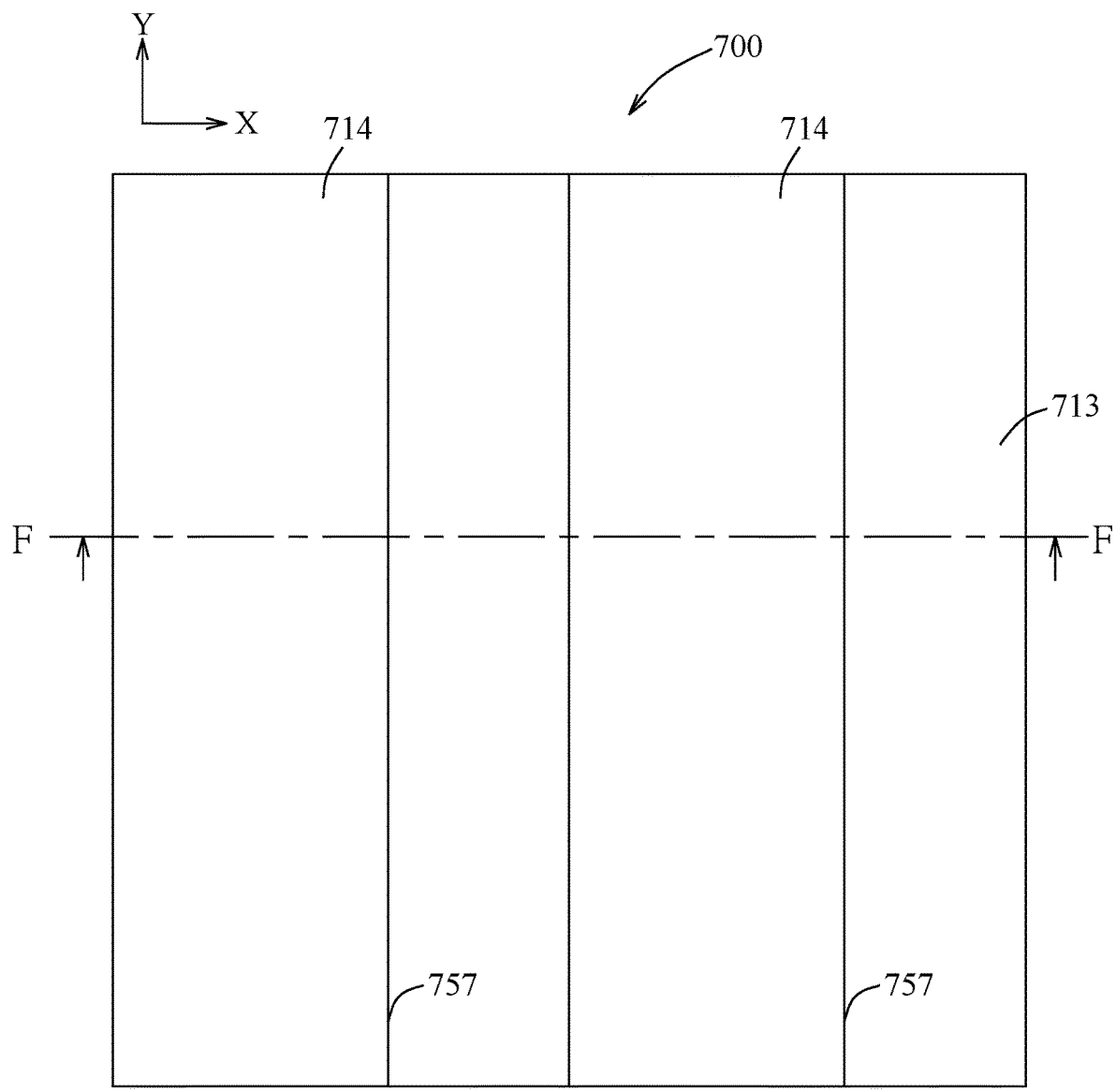

Referring to FIGS. 15 and 16, where FIG. 15 illustrates a schematic sectional view taken along line F-F in FIG. 16, the method 600 then proceeds to block 605, where a plurality of first gate electrode strips 714 extending in the Y direction are formed on the first gate dielectric layer 712. The first gate electrode strips 714 respectively overlap the first channel feature strips 709. Block 605 may be implemented as described below. Firstly, a fourth ILD layer 713 is deposited on the first gate dielectric layer 712. Secondly, the fourth ILD layer 713 is patterned to form a plurality of fifth trenches 757 that extend in the Y direction and that expose the first gate dielectric layer 712. The fifth trenches 757 respectively overlap the first channel feature strips 709. Thirdly, a conductive material is deposited on the fourth ILD layer 713 so as to fill the fifth trenches 757. Portions of the conductive material in the fifth trenches 757 are referred to as the first gate electrode strips 714. In some embodiments, the fourth ILD layer 713 may be patterned using a photolithography process and an etching process. The photolithography process may include, for example, but not limited to, coating the fourth ILD layer 713 with a photoresist, soft-baking, exposing the photoresist through a photomask, post-exposure baking, developing the photoresist, and hard-baking, so as to form a patterned photoresist. The etching process may be implemented by etching the fourth ILD layer 713 through the patterned photoresist using, for example, dry etching, wet etching, other suitable techniques, or combinations thereof. The patterned photoresist may be removed after the etching process. In some embodiments, the conductive material may be deposited using, for example, CVD, PECVD, PVD, ALD, other suitable deposition techniques, or combinations thereof. In some embodiments, the fourth ILD layer 713 may include, for example, silicon oxide, silicon nitride, silicon oxynitride, fluoride-doped silicate glass, a material with low dielectric constant, other suitable materials, or combinations thereof. In some embodiments, the conductive material may include TaN, TiN, W, Al, polysilicon, other suitable materials, or combinations thereof.

Figure 17:
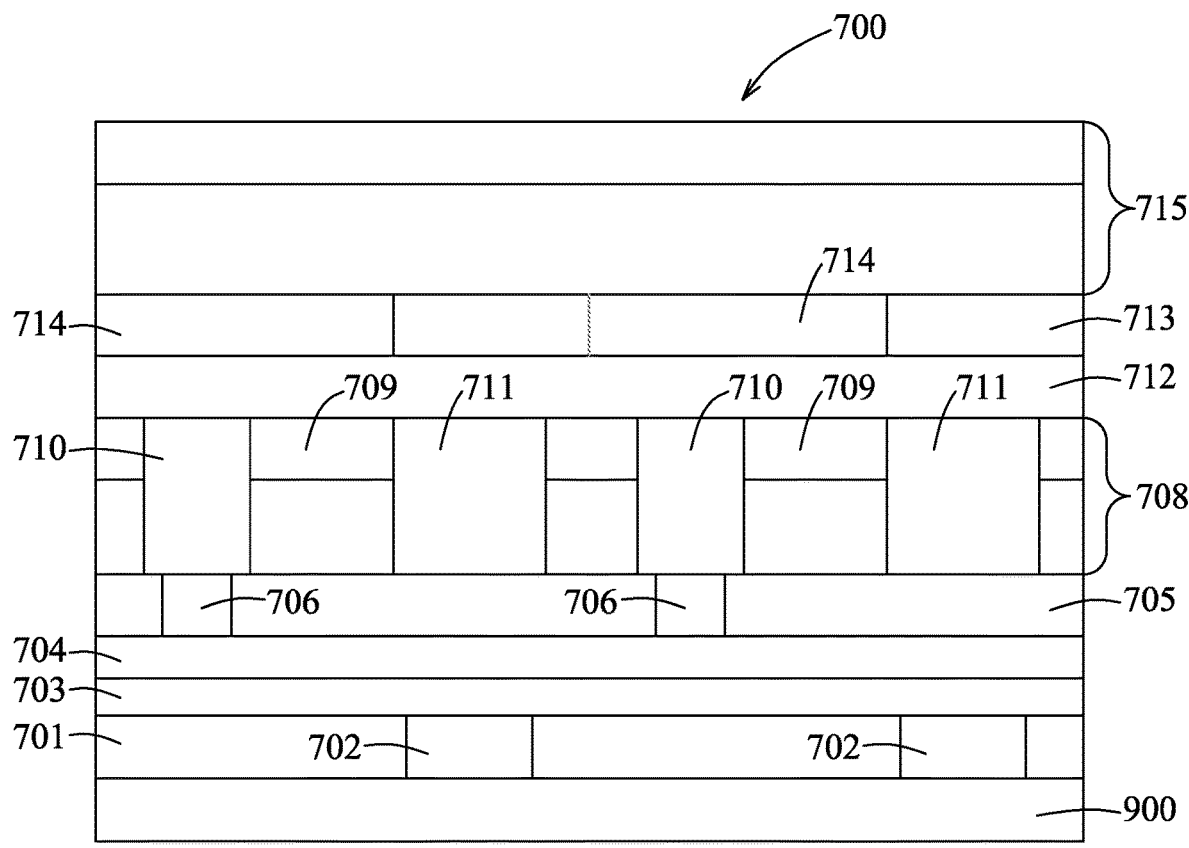
Figure 18:
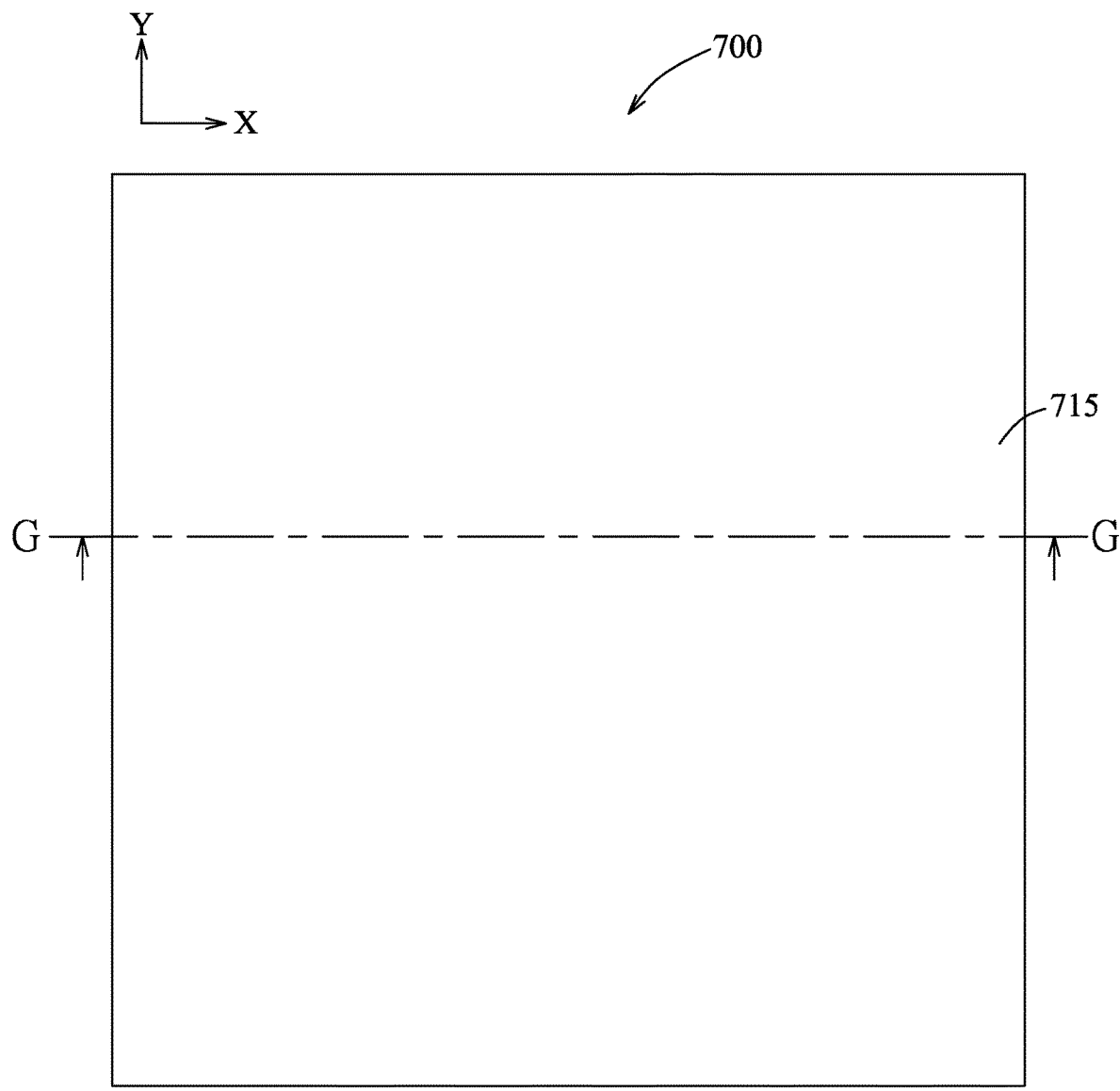

Referring to FIGS. 17 and 18, where FIG. 17 illustrates a schematic sectional view taken along line G-G in FIG. 18, the method 600 then proceeds to block 606, where excess portions of the fourth ILD layer 13 and the first gate electrode strips 714 are removed, and then a second channel feature layer 715 is formed on the fourth ILD layer 13 and the first gate electrode strips 714. The second channel feature layer 715 includes a plurality of channel layers (e.g., two channel layers as shown in FIG. 17) that are arranged from bottom to top. In some embodiments, the excess portions of the fourth ILD layer 13 and the first gate electrode strips 714 may be removed using, for example, CMP, or other suitable planarization techniques. In some embodiments, each of the channel layers may be formed using, for example, CVD, PECVD, PVD, ALD, other suitable deposition techniques, or combinations thereof. In some embodiments, the channel layers may be n-type doped, and may include IGZO, ZnO, In$_2$O$_3$, SnO$_2$, other suitable materials, or combinations thereof. In some embodiments, one of the channel layers has a doping concentration greater than that of a next one of the channel layers in a top-to-bottom direction of the channel layers.

Figure 19:
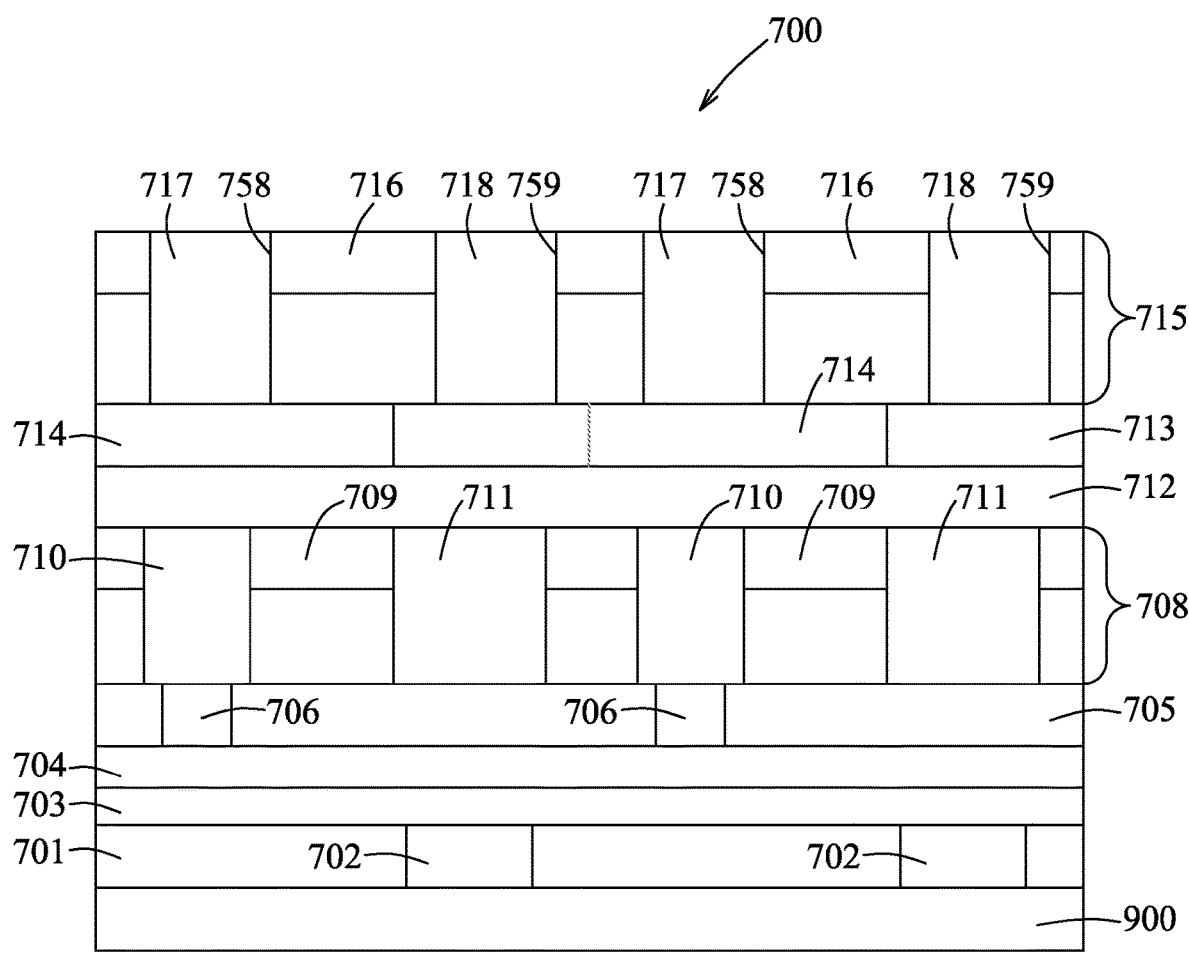
Figure 20:
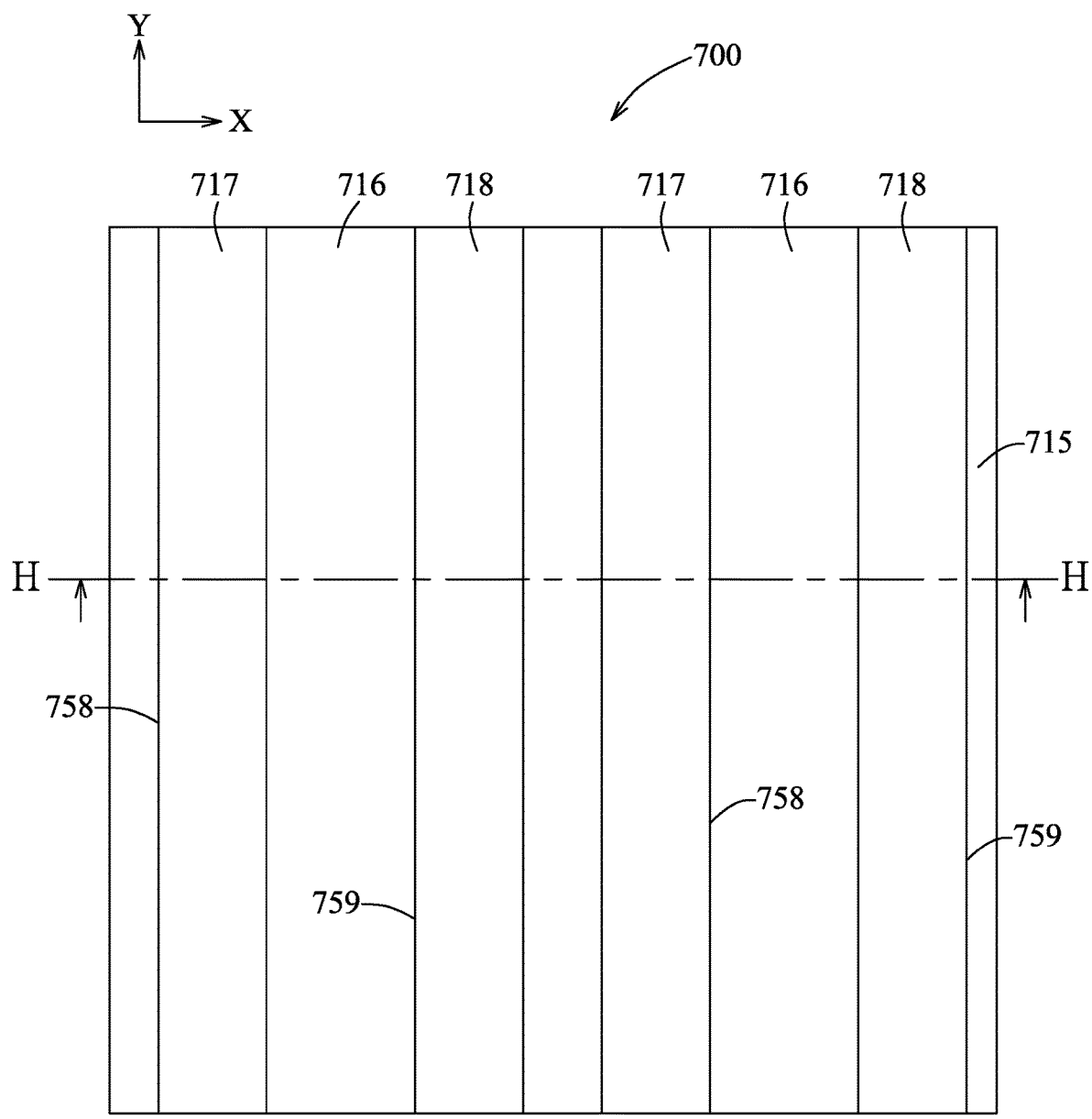

Referring to FIGS. 19 and 20, where FIG. 19 illustrates a schematic sectional view taken along line H-H in FIG. 20, the method 600 then proceeds to block 607, where a plurality of third source/drain electrode strips 717 extending in the Y direction and a plurality of fourth source/drain electrode strips 718 extending in the Y direction are formed in the second channel feature layer 715. The third source/drain electrode strips 717 are arranged alternatingly with the fourth source/drain electrode strips 718. The third source/drain electrode strips 717 respectively contact the first gate electrode strips 714. The fourth source/drain electrode strips 718 respectively contact portions of the fourth ILD layer 713. Block 607 may be implemented as described below. Firstly, the second channel feature layer 715 is patterned to form a plurality of sixth trenches 758 that extend in the Y direction and that respectively expose the first gate electrode strips 714, and a plurality of seventh trenches 759 that extend in the Y direction and that respectively expose the portions of the fourth ILD layer 713. Secondly, a conductive material is deposited on the second channel feature layer 715 so as to fill the sixth and seventh trenches 758, 759. Thirdly, an excess portion of the conductive material on the second channel feature layer 715 is removed. The remaining portions of the conductive material in the sixth trenches 758 are referred to as the third source/drain electrode strips 717. The remaining portions of the conductive material in the seventh trenches 759 are referred to as the fourth source/drain electrode strips 718. Portions of the second channel feature layer 715, each between a respective one of the third source/drain electrode strips 717 and a respective one of the fourth source/drain electrode strips 718, are referred to as second channel feature strips 716. In some embodiments, the second channel feature layer 715 may be patterned using a photolithography process and an etching process. The photolithography process may include, for example, but not limited to, coating the second channel feature layer 715 with a photoresist, soft-baking, exposing the photoresist through a photomask, post-exposure baking, developing the photoresist, and hard-baking, so as to form a patterned photoresist. The etching process may be implemented by etching the second channel feature layer 715 through the patterned photoresist using, for example, dry etching, wet etching, other suitable techniques, or combinations thereof. The patterned photoresist may be removed after the etching process. In some embodiments, the conductive material may be deposited using, for example, CVD, PECVD, PVD, ALD, other suitable deposition techniques, or combinations thereof. In some embodiments, the excess portion of the conductive material may be removed using, for example, CMP, or other suitable planarization techniques. In some embodiments, the conductive material may include TaN, TiN, W, Al, polysilicon, Ru, Co, Cu, other suitable materials, or combinations thereof.

Figure 21:
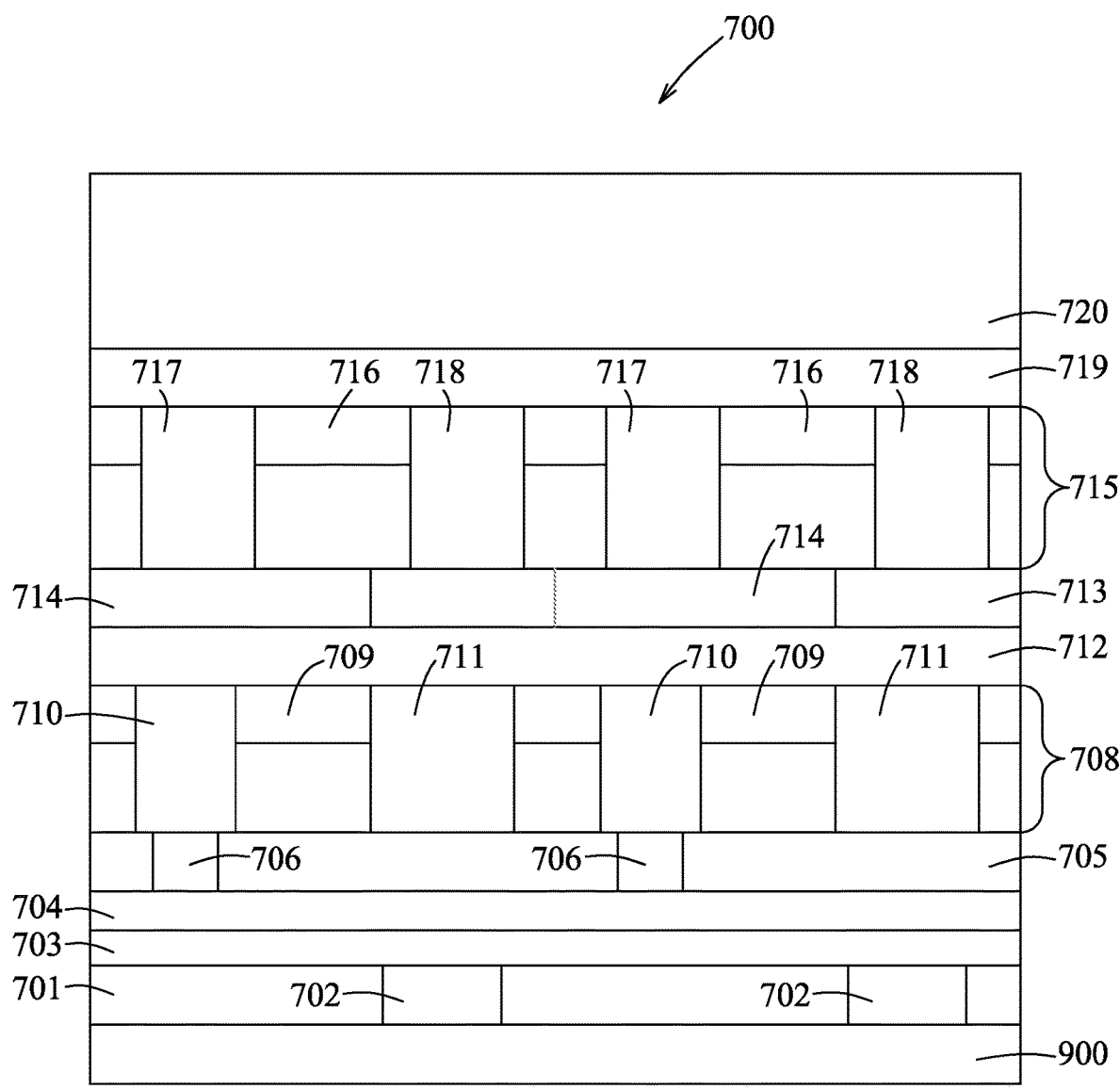
Figure 22:
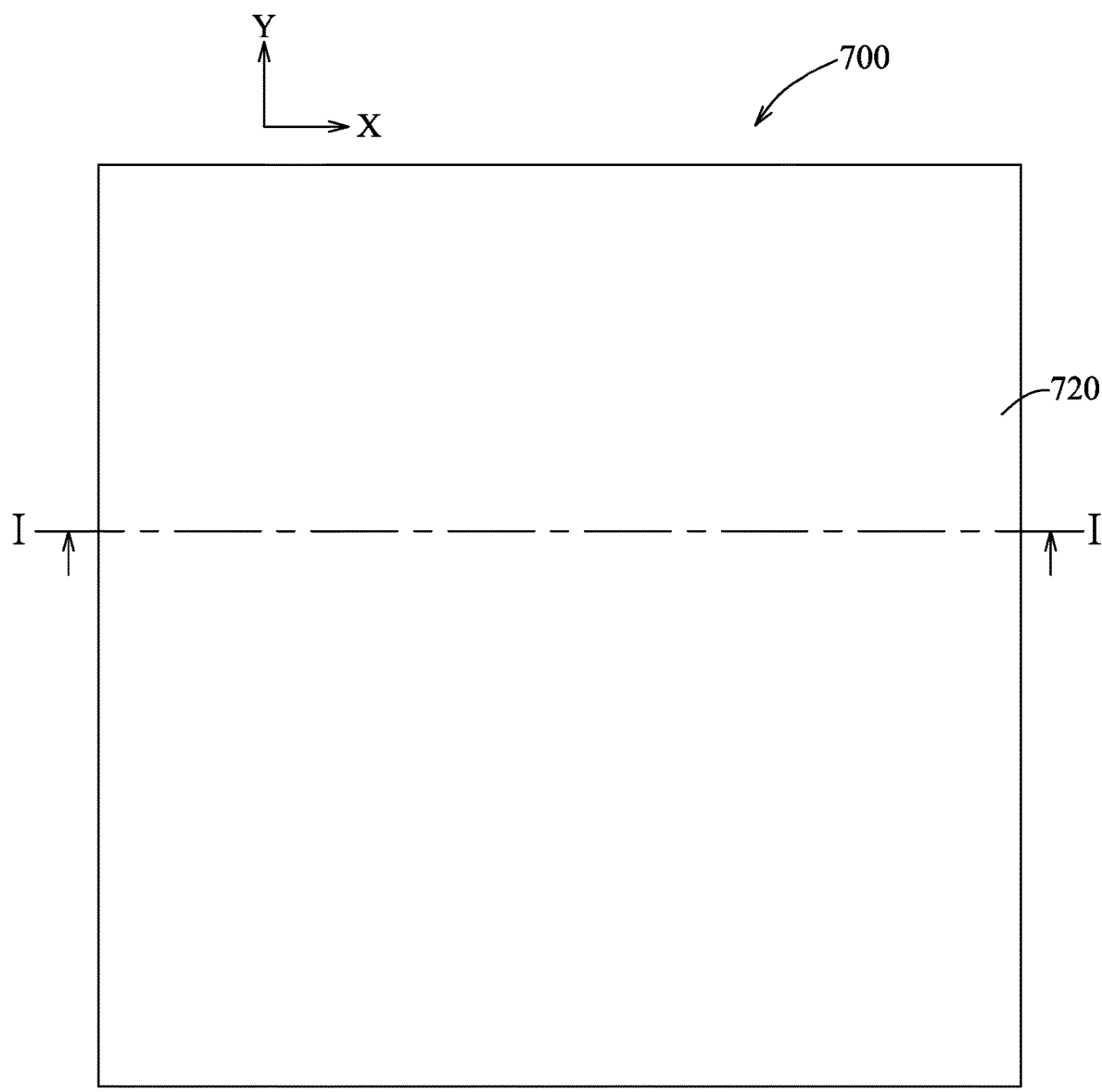

Referring to FIGS. 21 and 22, where FIG. 21 illustrates a schematic sectional view taken along line I-I in FIG. 22, the method 600 then proceeds to block 608, where a second gate dielectric layer 719 and a second gate electrode layer 720 are sequentially formed on the second channel feature layer 715, the third source/drain electrode strips 717 and the fourth source/drain electrode strips 718. In some embodiments, the second gate dielectric layer 719 may be formed using, for example, CVD, ALD, other suitable deposition techniques, or combinations thereof. In some embodiments, the second gate electrode layer 720 may be formed using, for example, CVD, PECVD, PVD, ALD, other suitable deposition techniques, or combinations thereof. In some embodiments, the second gate dielectric layer 719 may include a material with high dielectric constant such as HfO$_2$, SiO$_2$, Al$_2$O$_3$, SiON, other suitable materials, or combinations thereof. In some embodiments, the second gate electrode layer 720 may include TaN, TiN, W, Al, polysilicon, other suitable materials, or combinations thereof.

Figure 23:
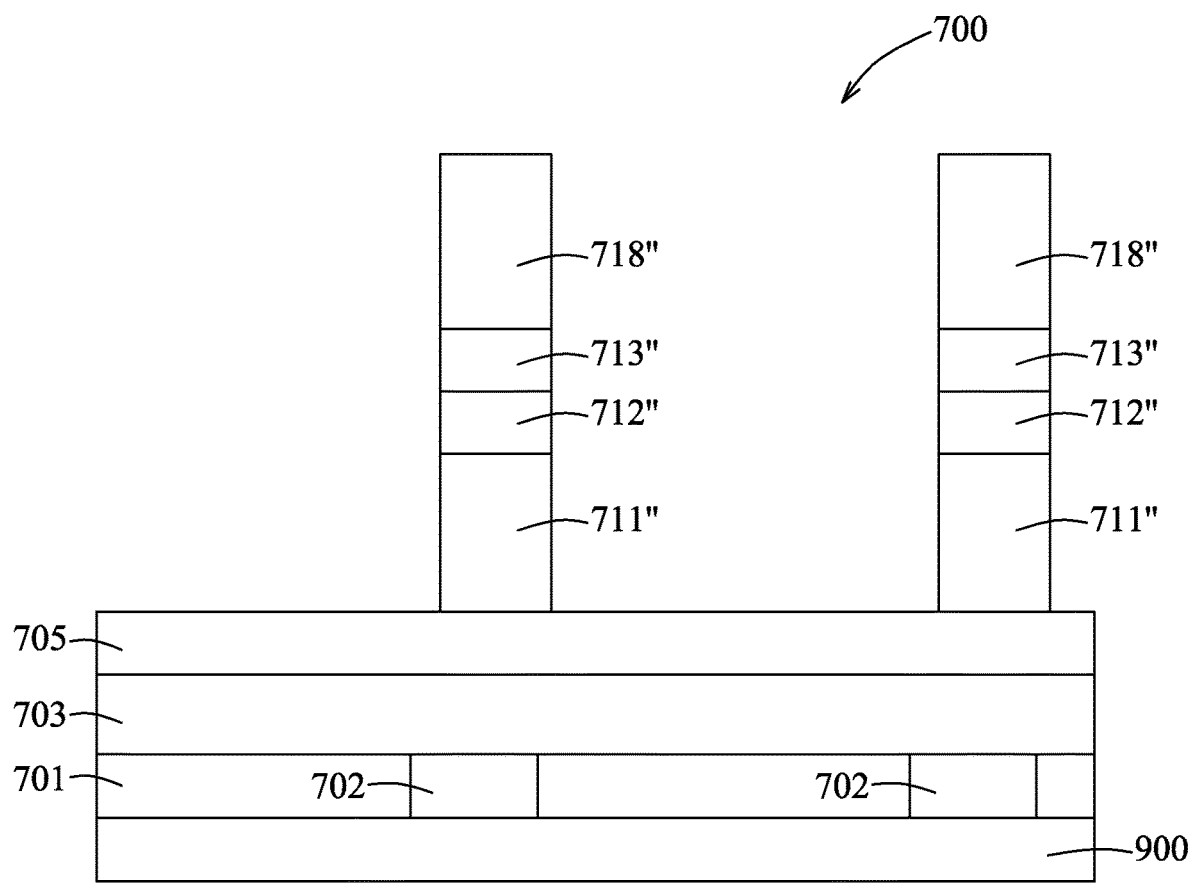
Figure 24:
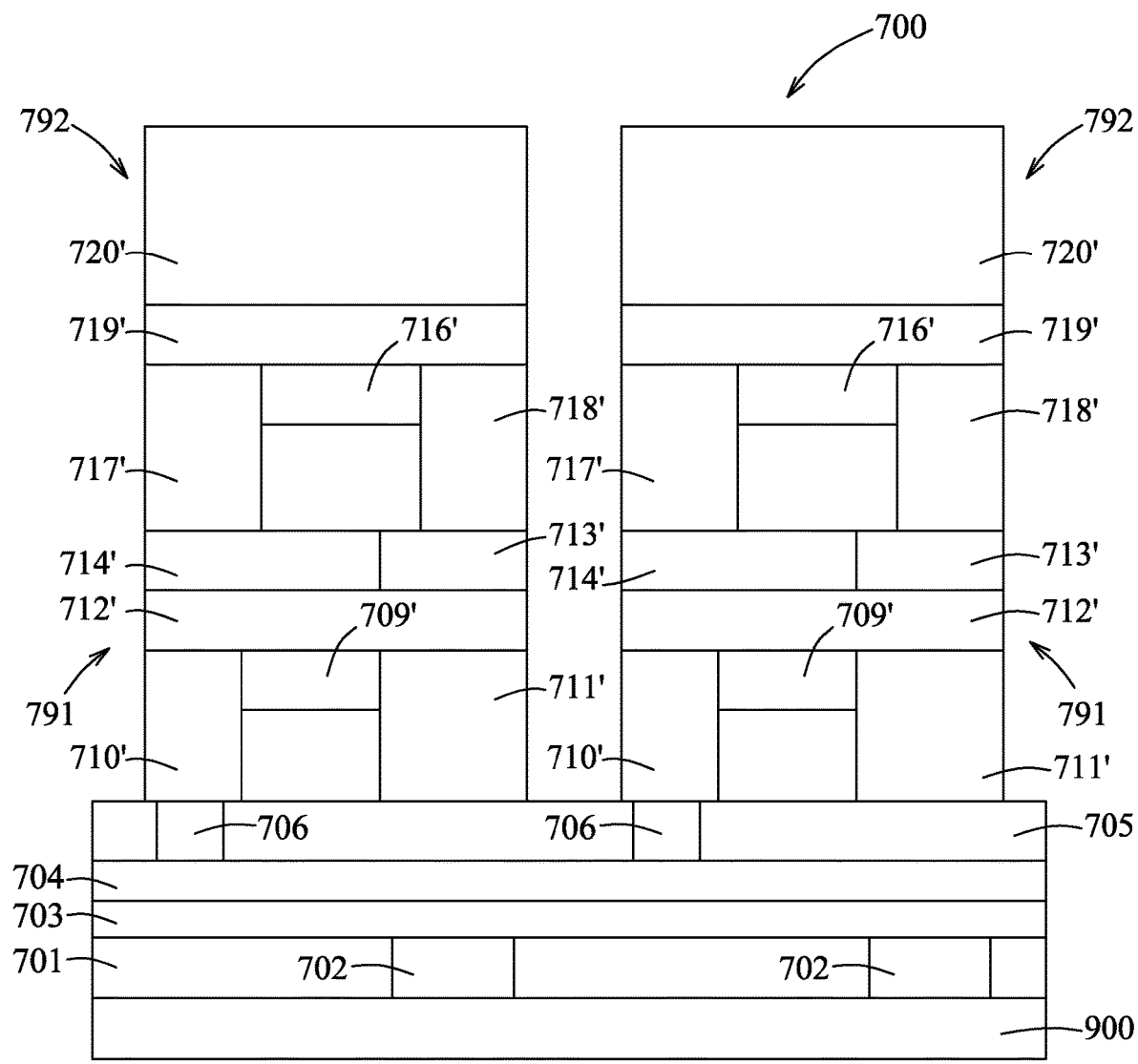
Figure 25:
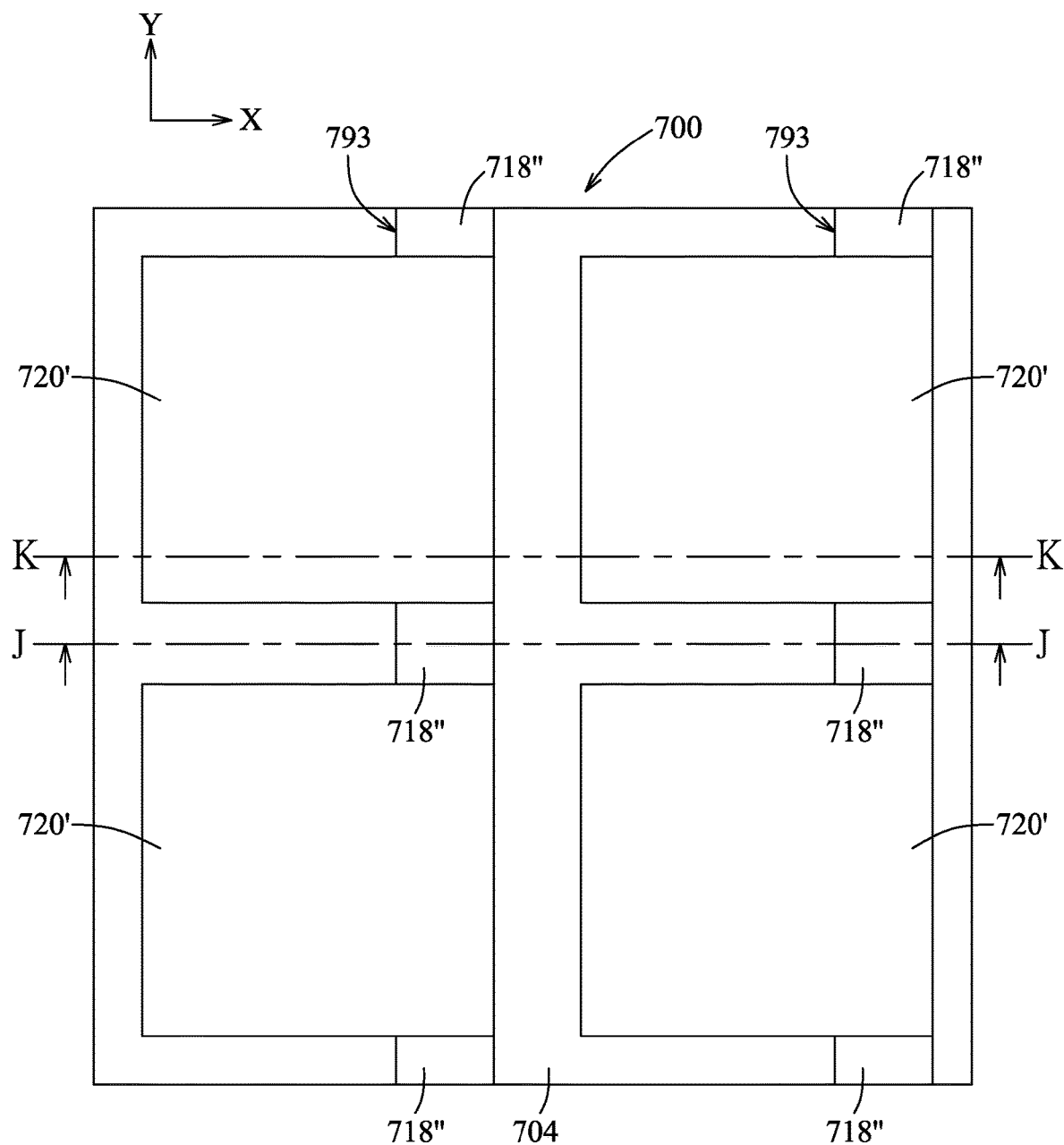

Referring to FIGS. 21, 22, 23, 24 and 25, where FIG. 23 illustrates a schematic sectional view taken along line J-J in FIG. 25 and FIG. 24 illustrates a schematic sectional view taken along line K-K in FIG. 25, the method 600 then proceeds to block 609, where a plurality of first transistors 791, a plurality of second transistors 792 respectively disposed above the first transistors 791, and a plurality of write bit lines 793 extending in the Y direction are formed. In some embodiments, the second gate electrode layer 720, the second gate dielectric layer 719, the second channel feature layer 715, the third source/drain electrode strips 717, the fourth ILD layer 713, the first gate electrode strips 714, the first gate dielectric layer 712, the first channel feature layer 708, the first and second source/drain electrode strips 710, 711 are patterned to form a plurality of second gate electrodes 720', a plurality of second gate dielectrics 719', a plurality of second channel features 716', a plurality of third source/drain electrodes 717', a plurality of fourth source/drain electrodes 718', a plurality of ILD elements 713', a plurality of first gate electrodes 714', a plurality of first gate dielectrics 712', a plurality of first channel features 709', a plurality of first source/drain electrodes 710', a plurality of second source/drain electrodes 711', a plurality of first connection elements 718'', a plurality of second connection elements 713'', a plurality of third connection elements 712'', and a plurality of fourth connection elements 711''. The second gate dielectrics 719' are respectively aligned with the second gate electrodes 720'. Each of the second channel features 716', a respective one of the third source/drain electrodes 717' and a respective one of the fourth source/drain electrodes 718' constitute a combination that is aligned with a respective one of the second gate electrodes 720'. Each of the ILD elements 713' and a respective one of the first gate electrodes 714' constitute a combination that is aligned with a respective one of the second gate electrodes 720'. The first gate dielectrics 712' are respectively aligned with the second gate electrodes 720'. Each of the first channel features 709', a respective one of the first source/drain electrodes 710' and a respective one of the second source/drain electrodes 711' constitute a combination that is aligned with a respective one of the second gate electrodes 720'. Each of the first connection elements 718" is connected to at least one of the fourth source/drain electrodes 718'. The second connection elements 713" are respectively aligned with the first connection elements 718" and each of the second connection elements 713" is connected to at least one of the ILD elements 713'. The third connection elements 712" are respectively aligned with the first connection elements 718" and each of the third connection elements 712" is connected to at least one of the first gate dielectrics 712'. The fourth connection elements 711" are respectively aligned with the first connection elements 718" and each of the fourth connection elements 711" is connected to at least one of the second source/drain electrodes 711'. Each of the second gate electrodes 720', an aligned one of the second gate dielectrics 719', an aligned one of the second channel feature 716', an aligned one of the third source/drain electrodes 717' and an aligned one of the fourth source/drain electrodes 718' cooperatively constitute a respective one of the second transistors 792, and would respectively serve as the gate electrode 325, the gate dielectric 324, the channel feature 323, the first source/drain electrode 321 and the second source/drain electrode 322 of the second transistor 152 of a corresponding one of the memory cells 15 (see FIGS. 1 and 3); and with respect to the second gate electrode 720', an aligned one of the first gate electrode 714', an aligned one of the first gate dielectrics 712', an aligned one of the first channel feature 709', an aligned one of the first source/drain electrodes 710' and an aligned one of the second source/drain electrodes 711' cooperatively constitute a respective one of the first transistors 791, and would respectively serve as the gate electrode 315, the gate dielectric 314, the channel feature 313, the first source/drain electrode 311 and the second source/drain electrode 312 of the first transistor 151 of the corresponding one of the memory cells 15 (see FIGS. 1 and 3). With respect to each of the fourth source/drain strips 718, ones of the fourth source/drain electrodes 718' and ones of the first connection elements 718" that originate from the fourth source/drain strip 718 cooperatively constitute a respective one of the write bit lines 793 that would serve as the write bit lines 12 (see FIG. 1). In some embodiments, the patterning may be implemented using a photolithography process and an etching process. The photolithography process may include, for example, but not limited to, coating the second gate electrode layer 720 with a photoresist, soft-baking, exposing the photoresist through a photomask, post-exposure baking, developing the photoresist, and hard-baking, so as to form a patterned photoresist. The etching process may be implemented using, for example, dry etching, wet etching, other suitable techniques, or combinations thereof. The patterned photoresist may be removed after the etching process.

Figure 26:
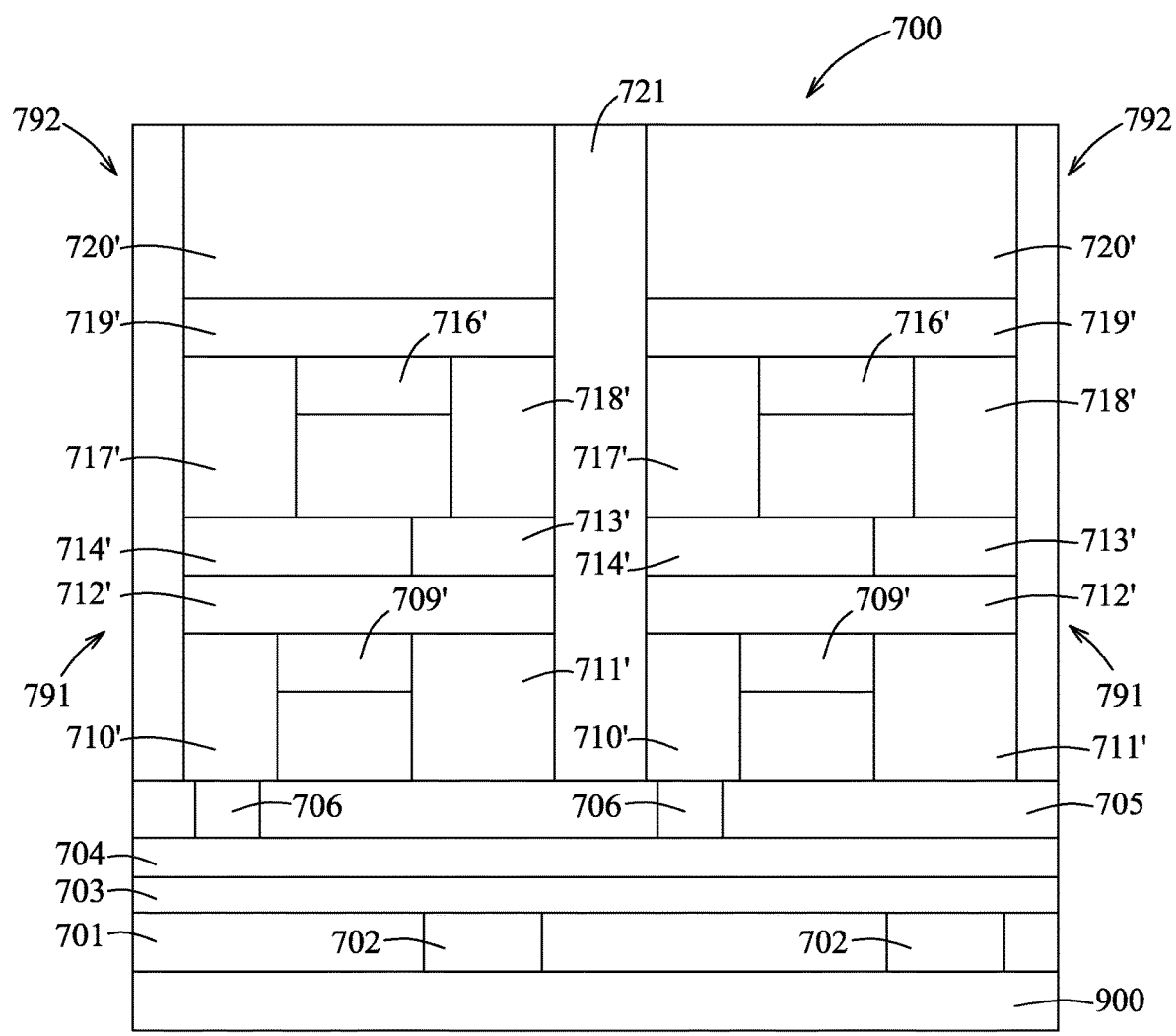
Figure 27:
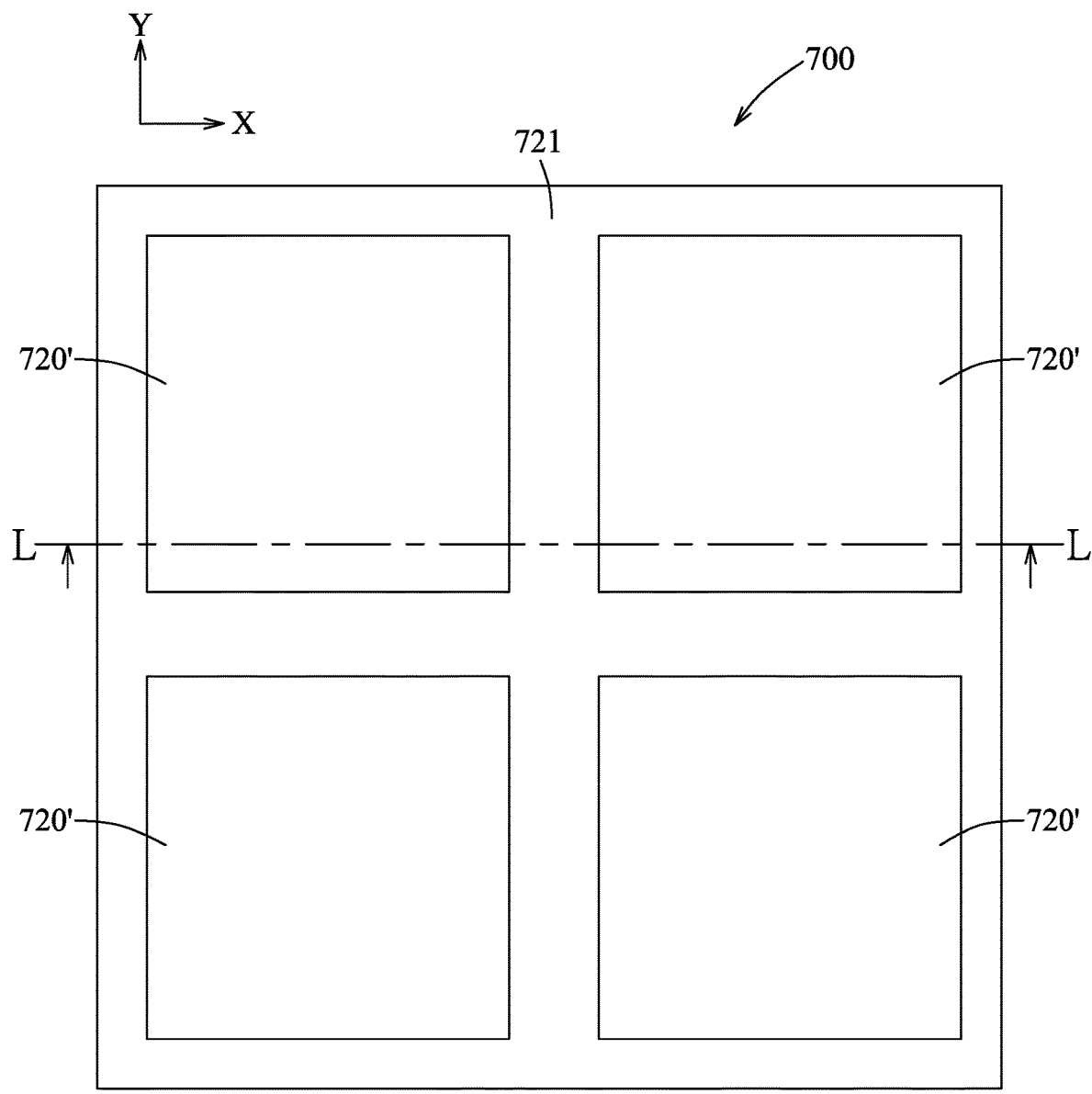

Referring to FIGS. 26 and 27, where FIG. 26 illustrates a schematic sectional view taken along line L-L in FIG. 27, the method 600 then proceeds to block 610, where an insulator layer 721 is formed. Block 610 may be implemented as described below. Firstly, a dielectric material is deposited on the second gate electrodes 720'. Secondly, an excess portion of the dielectric material on the second gate electrodes 720' is removed. The remaining portion of the dielectric material is referred to as the insulator layer 721. In some embodiments, the dielectric material may be deposited using, for example, CVD, PECVD, PVD, ALD, other suitable deposition techniques, or combinations thereof. In some embodiments, the excess portion of the dielectric material may be removed using, for example, CMP, or other suitable planarization techniques. In some embodiments, the insulator layer 721 may include, for example, silicon oxide, silicon nitride, silicon oxynitride, fluoride-doped silicate glass, a material with low dielectric constant, other suitable materials, or combinations thereof.

Figure 28:
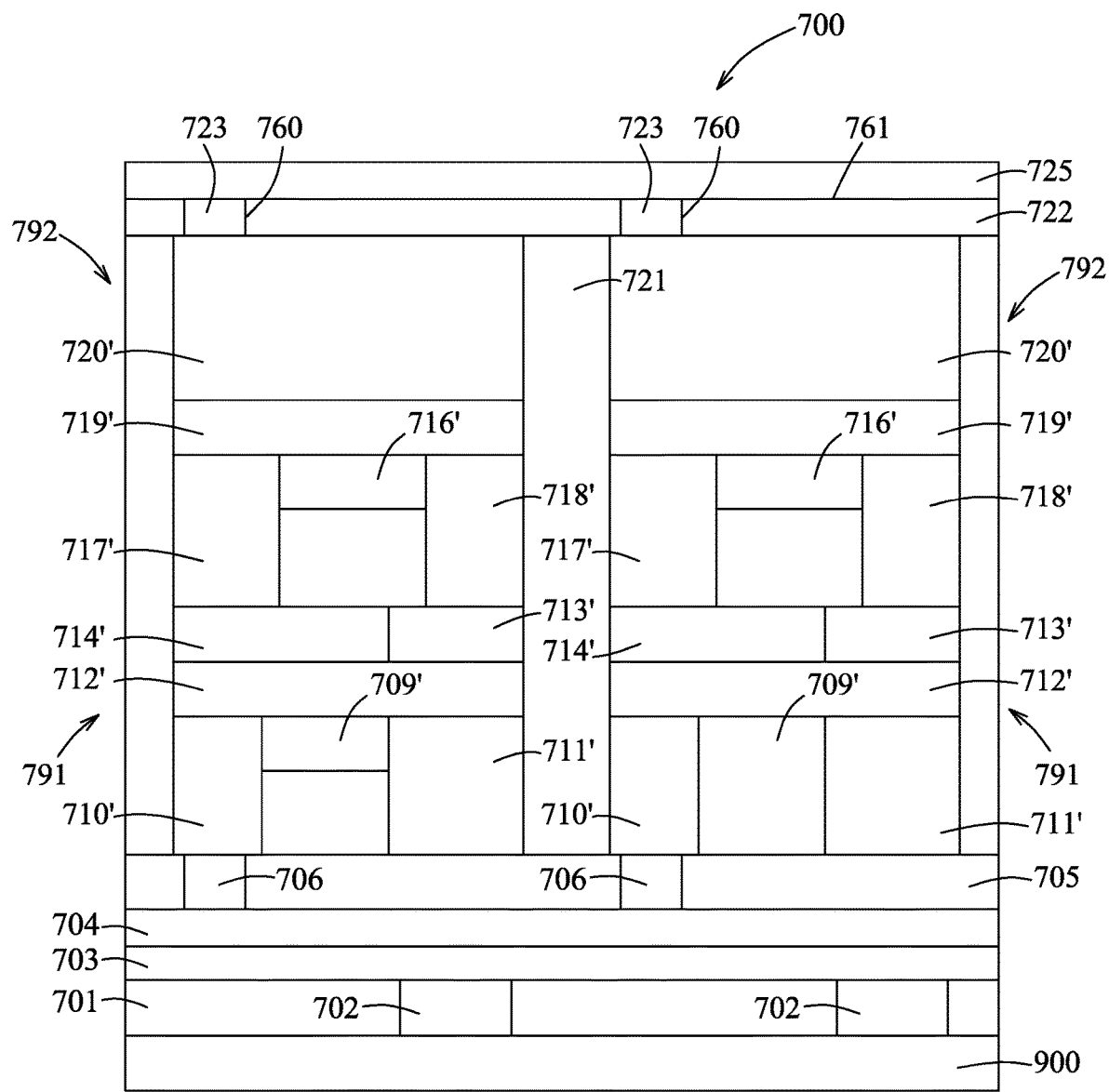
Figure 29:
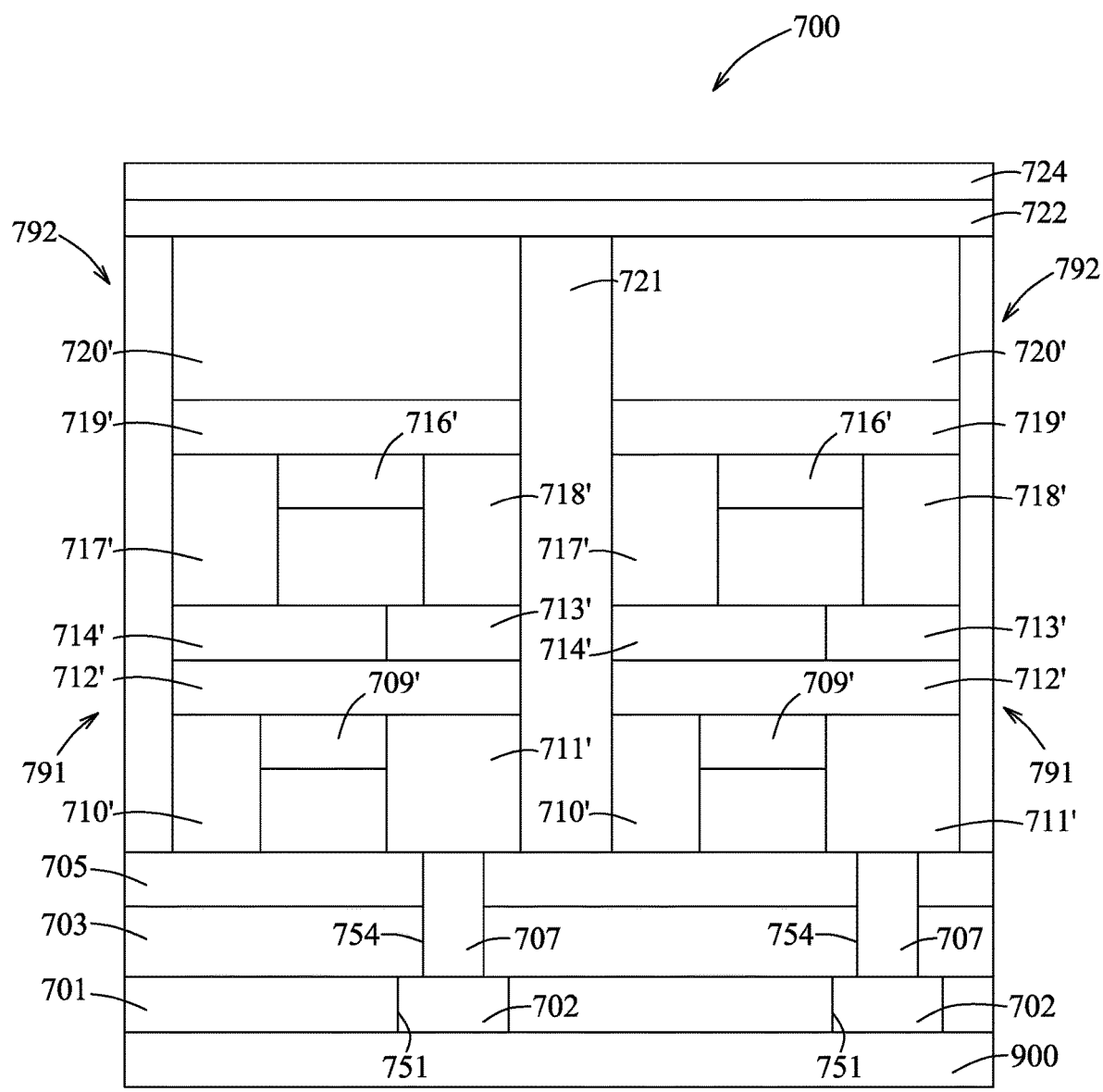
Figure 30:
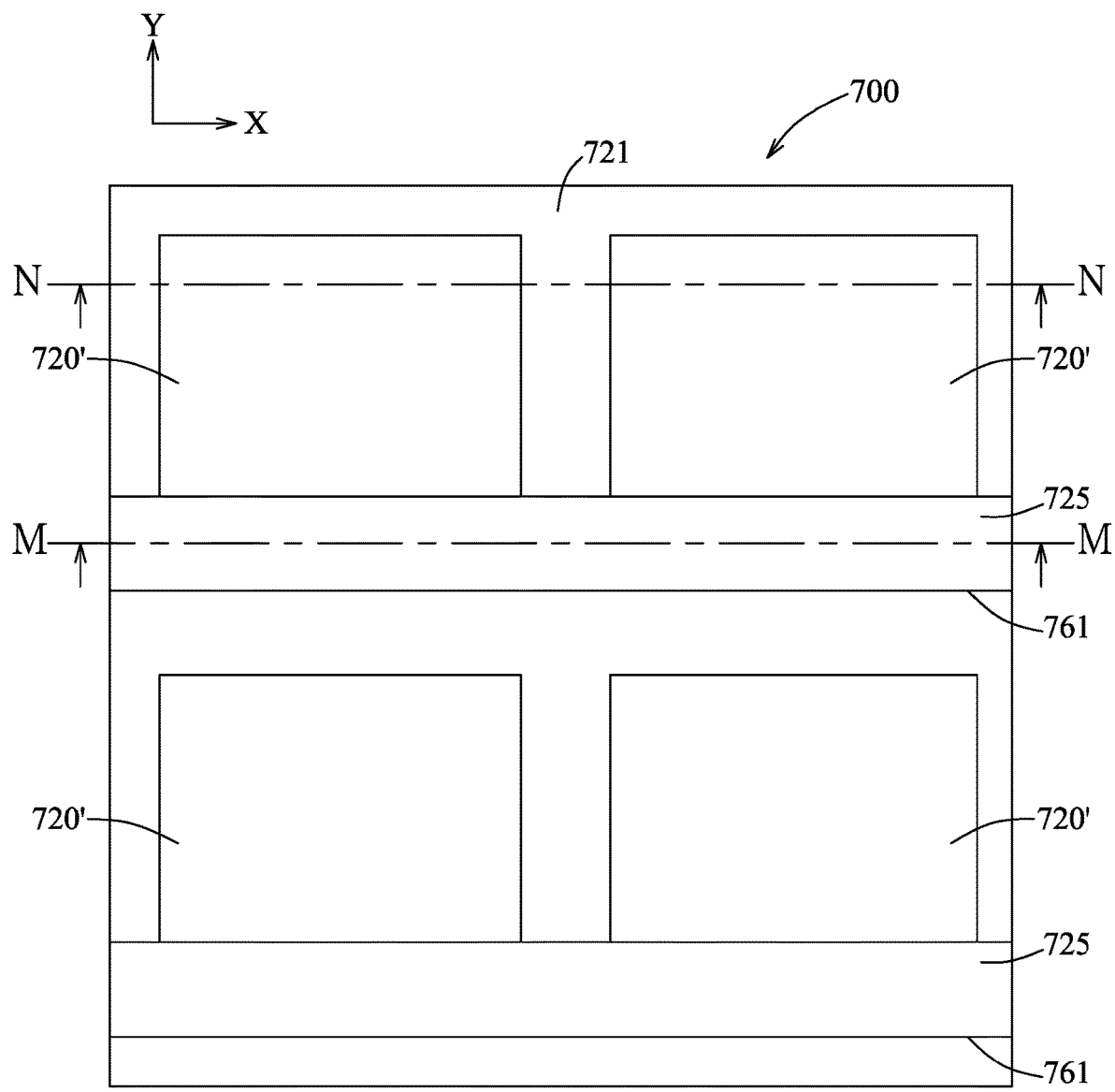

Referring to FIGS. 28, 29 and 30, where FIG. 28 illustrates a schematic sectional view taken along line M-M in FIG. 30 and FIG. 29 illustrates a schematic sectional view taken along line N-N in FIG. 30, the method 600 then proceeds to block 611, where a plurality of write word lines 725 extending in the X direction are formed. Block 611 may be implemented as described below. Firstly, a fifth ILD layer 722 is deposited on the second gate electrodes 720' and the insulator layer 721; the fifth ILD layer 722 is patterned to form a plurality of third via holes 760 that respectively expose the second gate electrodes 720'; a conductive material is deposited on the fifth ILD layer 722 so as to fill the third via holes 760; and then an excess portion of the conductive material on the fifth ILD layer 722 is removed. The remaining portions of the conductive material in the third via holes 760 are referred to as the third connection vias 723. Secondly, a sixth ILD layer 724 is deposited on the fifth ILD layer 722 and the third connection vias 723; the sixth ILD layer 724 is patterned to form a plurality of eighth trenches 761 that extend in the X direction and that expose the third connection vias 723; a conductive material is deposited on the fifth ILD layer 724 so as to fill the eighth trenches 761; and an excess portion of the conductive material on the fifth ILD layer 724 is removed. The remaining portions of the conductive material in the eighth trenches 761 are referred to as the write word lines 725 that would serve as the write word lines 11 (see FIG. 1). It should be noted that the fourth and fifth ILD layers 722, 724 are omitted from FIG. 30 in order to show the main structure of the semiconductor structure 700 clearly. In some embodiments, each of the fifth and sixth ILD layers 722, 724 and the conductive materials for forming the third connection vias 723 and the write word lines 725 may be deposited using, for example, CVD, PECVD, PVD, ALD, other suitable deposition techniques, or combinations thereof. In some embodiments, each of the fifth and sixth ILD layers 722, 724 may be patterned using a photolithography process and an etching process. The photolithography process for patterning each of the fifth and sixth ILD layers 722, 724 may include, for example, but not limited to, coating the ILD layer 722/724 with a photoresist, soft-baking, exposing the photoresist through a photomask, post-exposure baking, developing the photoresist, and hard-baking, so as to form a patterned photoresist. The etching process for patterning each of the fifth and sixth ILD layers 722, 724 may be implemented by etching the ILD layer 722/724 through the patterned photoresist using, for example, dry etching, wet etching, other suitable techniques, or combinations thereof. The patterned photoresist may be removed after the etching process. In some embodiments, the excess portion of each of the conductive materials for forming the third connection vias 723 and the write word lines 725 may be removed using, for example, CMP, or other suitable planarization techniques. In some embodiments, each of the fifth and sixth ILD layers 722, 724 may include, for example, silicon oxide, silicon nitride, silicon oxynitride, fluoride-doped silicate glass, a material with low dielectric constant, other suitable materials, or combinations thereof. In some embodiments, each of the conductive materials for forming the third connection vias 723 and the write word lines 725 may include TaN, TiN, W, Al, polysilicon, Ru, Co, Cu, Al—Cu alloy, other suitable materials, or combinations thereof.

Referring back to FIGS. 1 and 3, in some embodiments, for each of the memory cells 15, the first and second transistors 151, 152 are stacked from bottom to top, so an area occupied by the memory cell 15 can be decreased to increase density of memory cells 15 in the memory device 100, and the gate electrode 315 of the first transistor 151 can be connected to the first source/drain electrode 321 of the second transistor 152 without complicated metal routing. Moreover, in some embodiments, for the channel feature 313/323 of each of the first and second transistors 151, 152 of each of the memory cells 15, the doping concentration of one of the layers is greater than the doping concentration of a next one of the layers in the top-to-bottom direction of the layers, so the threshold voltage of the transistor 151/152 can be well controlled. Furthermore, in some embodiments, the memory device 100 may be fabricated in the BEOL. When the memory device 100 is stacked above a CPU that writes data to and reads data from the memory device 100, memory write latency and memory read latency can be reduced.

Figure 31:
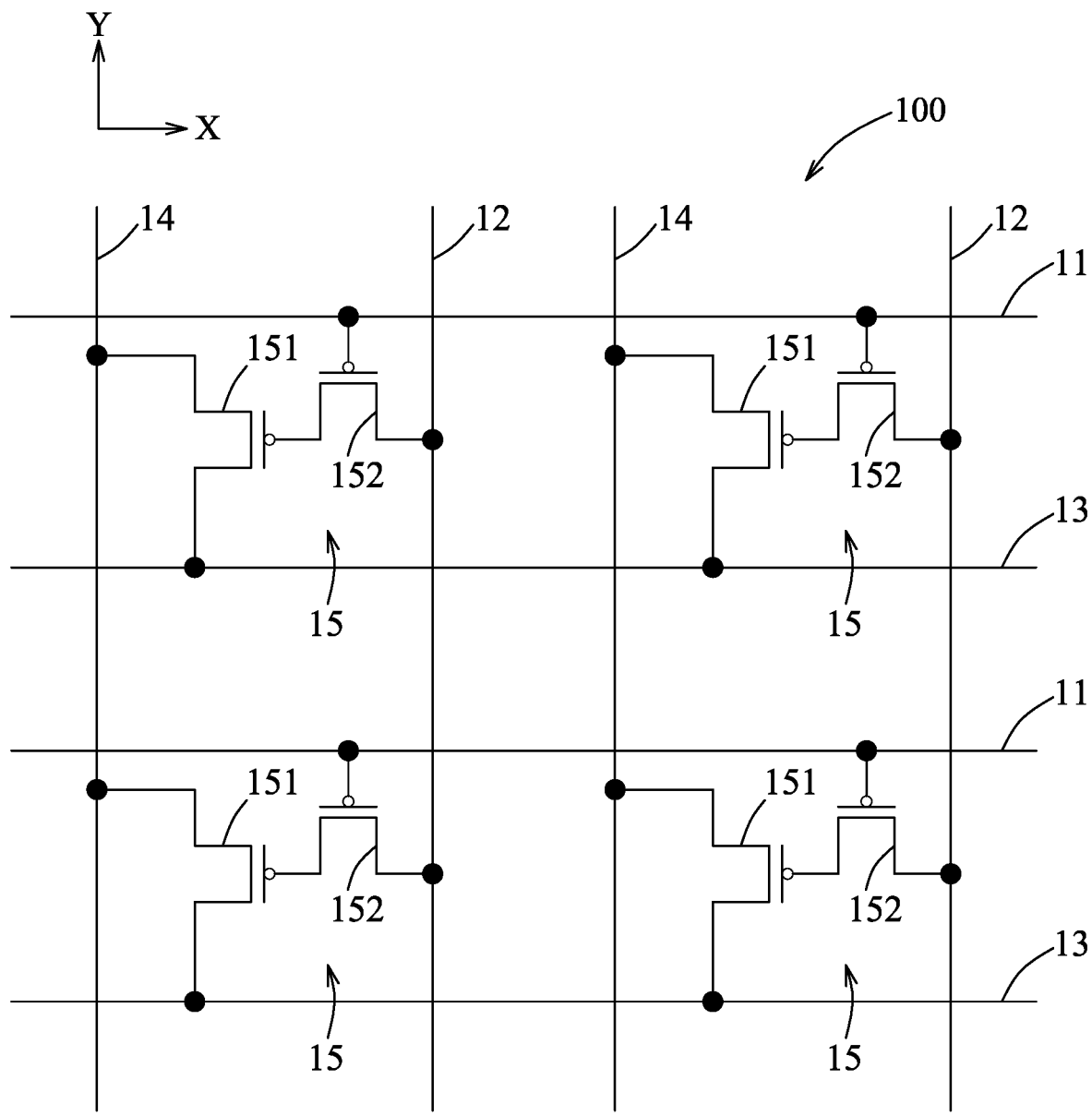
FIG. 31 is a circuit diagram illustrating a memory device in accordance with some embodiment.

FIG. 31 is a circuit diagram of a memory device 100 in accordance with some embodiments. The memory device 100 shown in FIG. 31 is similar to the memory device 100 shown in FIG. 1, but differs from the memory device 100 shown in FIG. 1 in that each of the first and second transistors 151, 152 of the memory cells 15 is a p-type transistor. In addition, the memory device 100 shown in FIG. 31 may be manufactured by a method which is similar to the method 600 shown in FIG. 4, but which differs from the method 600 in that: (a) in block 602, the channel layers of the first channel feature layer 708 (see FIG. 8)) are p-type doped, and may include NiO, $Cu_2O$, $CuAlO_2$, $CuInO_2$, $SrCu_2O_2$, SnO, other suitable materials, or combinations thereof; and (b) in block 606, the channel layers of the second channel feature layer 715 (see FIG. 17) are p-type doped, and may include NiO, $Cu_2O$, $CuAlO_2$, $CuInO_2$, $SrCu_2O_2$, SnO, other suitable materials, or combinations thereof.

Figure 32:
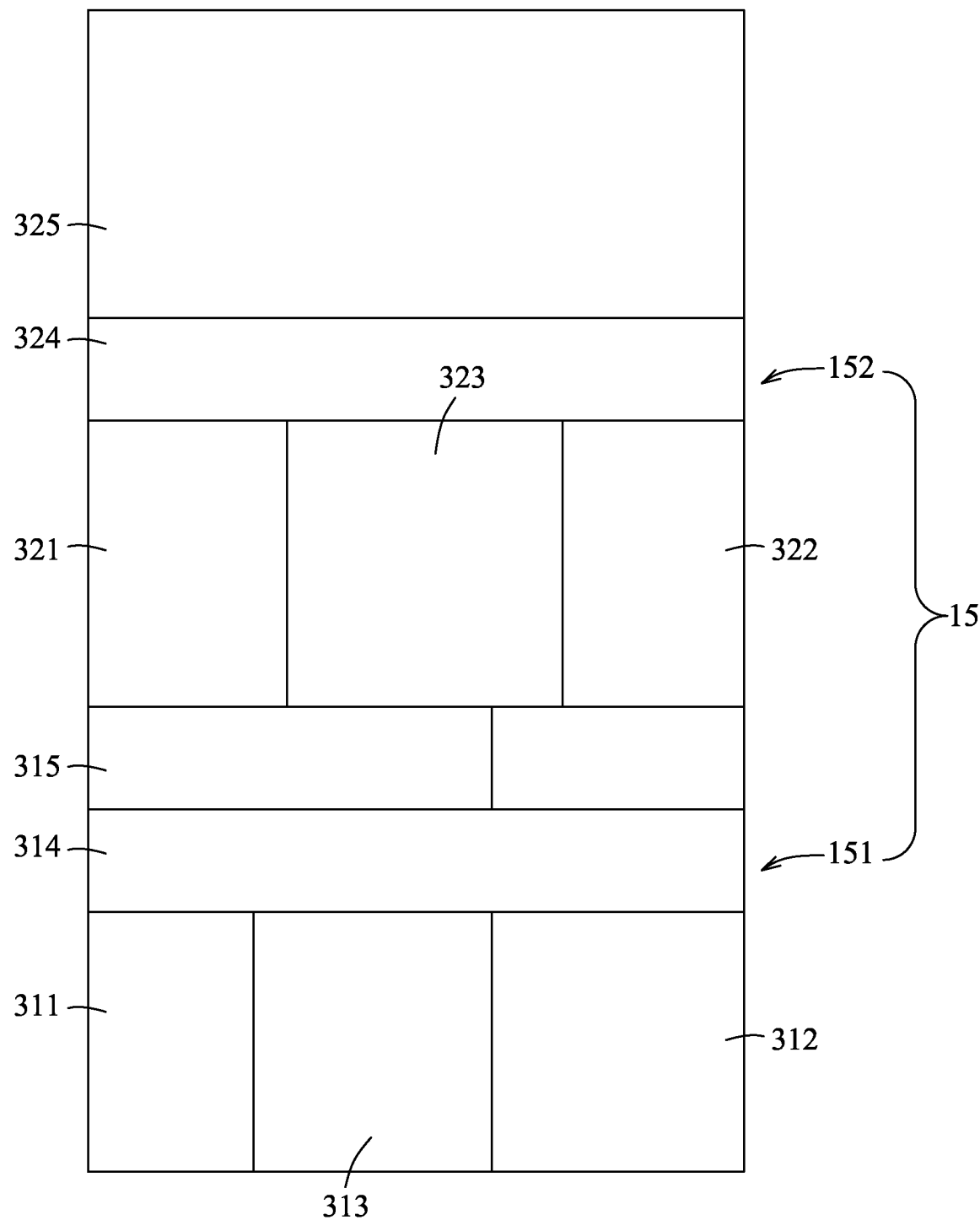
FIG. 32 is a schematic sectional view of a memory cell of a memory device in accordance with some embodiments.

FIG. 32 is a schematic sectional view of a memory cell 15 in accordance with some embodiments. The memory cell 15 shown in FIG. 32 is similar to the memory cell 15 shown in FIG. 3, but differs from the memory cell 15 shown in FIG. 3 in that the channel feature 313/323 of each of the first and second transistors 151, 152 includes a single layer. In addition, a memory device including a plurality of the memory cells 15 shown in FIG. 32 may be manufactured by a method which is similar to the method 600 shown in FIG. 4, but which differs from the method 600 in that: (a) in block 602, the first channel feature layer 708 (see FIG. 8) includes a single channel layer; and (b) in block 606, the second channel feature layer 715 (see FIG. 17) includes a single channel layer.

In accordance with some embodiments of the present disclosure, a memory device includes a first transistor and a second transistor. Each of the first and second transistors includes a first source/drain electrode, a second source/drain electrode, a channel feature, a gate dielectric and a gate electrode. The second source/drain electrode is coplanar with the first source/drain electrode. The channel feature is disposed between and interconnects the first and second source/drain electrodes. The gate dielectric is disposed over the channel feature. The gate electrode is disposed over the gate dielectric, and overlaps the channel feature. The second transistor is disposed over the first transistor, and the first source/drain electrode of the second transistor is connected to the gate electrode of the first transistor.

In accordance with some embodiments of the present disclosure, the channel features of the first and second transistors are n-type doped.

In accordance with some embodiments of the present disclosure, the channel features of the first and second transistors are p-type doped.

In accordance with some embodiments of the present disclosure, the channel feature of each of the first and second transistors includes a single layer.

In accordance with some embodiments of the present disclosure, the channel feature of each of the first and second transistors includes a plurality of layers that are arranged from bottom to top.

In accordance with some embodiments of the present disclosure, the layers of the channel features of the first and second transistors are doped to be a predetermined type, and the layers of the channel feature of each of the first and second transistors have different doping concentrations.

In accordance with some embodiments of the present disclosure, for the channel feature of each of the first and second transistors, the doping concentration of one of the layers is greater than the doping concentration of a next one of the layers in a top-to-bottom direction of the layers.

In accordance with some embodiments of the present disclosure, a memory device includes a first transistor and a second transistor. Each of the first and second transistors includes a first source/drain electrode, a second source/drain electrode, a channel feature, a gate electrode and a gate dielectric. The first and second source/drain electrodes and the channel feature are formed in one layer. The channel feature is disposed between and interconnects the first and second source/drain electrodes. The gate electrode is disposed over the layer where the first and second source/drain electrodes and the channel feature are formed. The gate dielectric is disposed between the channel feature and the gate electrode. The second transistor is disposed over the first transistor, and the first source/drain electrode of the second transistor is connected to the gate electrode of the first transistor.

In accordance with some embodiments of the present disclosure, the channel features of the first and second transistors are n-type doped.

In accordance with some embodiments of the present disclosure, the channel features of the first and second transistors are p-type doped.

In accordance with some embodiments of the present disclosure, the channel feature of each of the first and second transistors includes a single layer.

In accordance with some embodiments of the present disclosure, the channel feature of each of the first and second transistors includes a plurality of layers that are arranged from bottom to top.

In accordance with some embodiments of the present disclosure, the layers of the channel features of the first and second transistors are doped to be a predetermined type, and the layers of the channel feature of each of the first and second transistors have different doping concentrations.

In accordance with some embodiments of the present disclosure, for the channel feature of each of the first and second transistors, the doping concentration of one of the layers is greater than the doping concentration of a next one of the layers in a top-to-bottom direction of the layers.

In accordance with some embodiments of the present disclosure, a method for manufacturing a memory device includes: forming a first channel feature layer; forming a first source/drain electrode strip and a second source/drain electrode strip in the first channel feature layer, the first and second source/drain electrode strips extending in a predetermined direction, a first channel feature strip being formed between the first and second source/drain electrode strips; forming a first gate dielectric layer on the first and second source/drain electrode strips and the first channel feature layer; forming a first gate electrode strip on the first gate dielectric layer, the first gate electrode strip extending in the predetermined direction and overlapping the first channel feature strip; forming a second channel feature layer over the first gate electrode strip; forming a third source/drain electrode strip and a fourth source/drain electrode strip in the second channel feature layer, the third and fourth source/drain electrode strips extending in the predetermined direction, a second channel feature strip being formed between the third and fourth source/drain electrode strips, the third source/drain electrode strip being connected to the first gate electrode strip; forming a second gate dielectric layer on the third and fourth source/drain electrode strips and the second channel feature layer; and forming a second gate electrode layer on the second gate dielectric layer.

In accordance with some embodiments of the present disclosure, the first and second channel feature layers are n-type doped.

In accordance with some embodiments of the present disclosure, the first and second channel feature layers are p-type doped.

In accordance with some embodiments of the present disclosure, each of the first and second channel feature layers includes a single channel layer.

In accordance with some embodiments of the present disclosure, each of the first and second channel feature layers includes a plurality of channel layers that are arranged from bottom to top.

In accordance with some embodiments of the present disclosure, the channel layers of the first and second channel feature layers are doped to be a predetermined type; and for each of the first and second channel feature layers, one of the channel layers has a doping concentration greater than that of a next one of the channel layers in a top-to-bottom direction of the channel layers.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a first transistor and a second transistor;
wherein each of the first and second transistors includes
a first source/drain electrode,
a second source/drain electrode coplanar with the first source/drain electrode,
a channel feature disposed between and interconnecting the first and second source/drain electrodes,
a gate dielectric disposed over the channel feature, and
a gate electrode disposed over the gate dielectric, and overlapping the channel feature;
wherein the second transistor is disposed over the first transistor, and the first source/drain electrode of the second transistor is connected to the gate electrode of the first transistor.

2. The memory device according to claim 1, wherein the channel features of the first and second transistors are n-type doped.

3. The memory device according to claim 1, wherein the channel features of the first and second transistors are p-type doped.

4. The memory device according to claim 1, wherein the channel feature of each of the first and second transistors includes a single layer.

5. The memory device according to claim 1, wherein the channel feature of each of the first and second transistors includes a plurality of layers that are arranged from bottom to top.

6. The memory device according to claim 5, wherein the layers of the channel features of the first and second transistors are doped to be a predetermined type, and the layers of the channel feature of each of the first and second transistors have different doping concentrations.

7. The memory device according to claim 6, wherein, for the channel feature of each of the first and second transistors, the doping concentration of one of the layers is greater than the doping concentration of a next one of the layers in a top-to-bottom direction of the layers.

8. A memory device comprising:
a first transistor and a second transistor;
wherein each of the first and second transistors includes
a first source/drain electrode, a second source/drain electrode and a channel feature that are formed in one layer, the channel feature being disposed between and interconnecting the first and second source/drain electrodes,
a gate electrode disposed over the layer where the first and second source/drain electrodes and the channel feature are formed, and
a gate dielectric disposed between the channel feature and the gate electrode;
wherein the second transistor is disposed over the first transistor, and the first source/drain electrode of the second transistor is connected to the gate electrode of the first transistor.

9. The memory device according to claim 8, wherein the channel features of the first and second transistors are n-type doped.

10. The memory device according to claim 8, wherein the channel features of the first and second transistors are p-type doped.

11. The memory device according to claim 8, wherein the channel feature of each of the first and second transistors includes a single layer.

12. The memory device according to claim 8, wherein the channel feature of each of the first and second transistors includes a plurality of layers that are arranged from bottom to top.

13. The memory device according to claim 12, wherein the layers of the channel features of the first and second transistors are doped to be a predetermined type, and the layers of the channel feature of each of the first and second transistors have different doping concentrations.

14. The memory device according to claim 13, wherein, for the channel feature of each of the first and second transistors, the doping concentration of one of the layers is greater than the doping concentration of a next one of the layers in a top-to-bottom direction of the layers.

15. A method for manufacturing a memory device, comprising:
   forming a first channel feature layer;
   forming a first source/drain electrode strip and a second source/drain electrode strip in the first channel feature layer, the first and second source/drain electrode strips extending in a predetermined direction, a first channel feature strip being formed between the first and second source/drain electrode strips;
   forming a first gate dielectric layer on the first and second source/drain electrode strips and the first channel feature layer;
   forming a first gate electrode strip on the first gate dielectric layer, the first gate electrode strip extending in the predetermined direction and overlapping the first channel feature strip;
   forming a second channel feature layer over the first gate electrode strip;
   forming a third source/drain electrode strip and a fourth source/drain electrode strip in the second channel feature layer, the third and fourth source/drain electrode strips extending in the predetermined direction, a second channel feature strip being formed between the third and fourth source/drain electrode strips, the third source/drain electrode strip being connected to the first gate electrode strip;
   forming a second gate dielectric layer on the third and fourth source/drain electrode strips and the second channel feature layer; and
   forming a second gate electrode layer on the second gate dielectric layer.

16. The method according to claim 15, wherein the first and second channel feature layers are n-type doped.

17. The method according to claim 15, wherein the first and second channel feature layers are p-type doped.

18. The method according to claim 15, wherein each of the first and second channel feature layers includes a single channel layer.

19. The method according to claim 15, wherein each of the first and second channel feature layers includes a plurality of channel layers that are arranged from bottom to top.

20. The method according to claim 19, wherein:
   the channel layers of the first and second channel feature layers are doped to be a predetermined type; and
   for each of the first and second channel feature layers, one of the channel layers has a doping concentration greater than that of a next one of the channel layers in a top-to-bottom direction of the channel layers.

* * * * *